United States Patent
Ueno et al.

(10) Patent No.: US 8,927,962 B2
(45) Date of Patent: Jan. 6, 2015

(54) GROUP III NITRIDE SEMICONDUCTOR OPTICAL DEVICE

(75) Inventors: Masaki Ueno, Itami (JP); Yusuke Yoshizumi, Itami (JP); Yohei Enya, Itami (JP); Takashi Kyono, Itami (JP); Katsushi Akita, Itami (JP); Takamichi Sumitomo, Itami (JP); Masahiro Adachi, Osaka (JP); Shinji Tokuyama, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 783 days.

(21) Appl. No.: 13/055,690

(22) PCT Filed: Feb. 26, 2010

(86) PCT No.: PCT/JP2010/053101
§ 371 (c)(1),
(2), (4) Date: Jan. 24, 2011

(87) PCT Pub. No.: WO2011/007594
PCT Pub. Date: Jan. 20, 2011

(65) Prior Publication Data
US 2011/0121265 A1 May 26, 2011

(30) Foreign Application Priority Data
Jul. 15, 2009 (JP) ................. 2009-167143

(51) Int. Cl.
*H01L 29/66* (2006.01)
*H01L 33/32* (2010.01)
*H01S 5/343* (2006.01)
*B82Y 20/00* (2011.01)
*H01L 33/16* (2010.01)
*H01S 5/32* (2006.01)

(52) U.S. Cl.
CPC ............. *H01S 5/34333* (2013.01); *B82Y 20/00* (2013.01); *H01L 33/16* (2013.01); *H01L 33/32* (2013.01); *H01L 33/325* (2013.01); *H01S 5/3202* (2013.01)
USPC .......................................................... 257/14

(58) Field of Classification Search
CPC ....... H01L 33/16; H01L 33/32; H01L 33/325; H01S 5/3202
USPC ...................................................... 257/14–25
See application file for complete search history.

(56) References Cited

U.S. PATENT DOCUMENTS

| 6,229,151 B1 | 5/2001 | Takeuchi et al. |
| 6,657,234 B1 * | 12/2003 | Tanizawa ..................... 257/79 |
| 2001/0010372 A1 | 8/2001 | Takeuchi et al. |
| 2005/0156153 A1 * | 7/2005 | Futagawa ..................... 257/14 |
| 2007/0128753 A1 | 6/2007 | Oshima |

(Continued)

FOREIGN PATENT DOCUMENTS

| CN | 101009350 A | 8/2007 |
| JP | 11-112029 A | 4/1999 |

(Continued)

*Primary Examiner* — Shaun Campbell
*Assistant Examiner* — Raj R Gupta
(74) *Attorney, Agent, or Firm* — Venable LLP; Michael A. Sartori; Tamatane J. Aga

(57) ABSTRACT

A group III nitride semiconductor optical device 11*a* has a group III nitride semiconductor substrate 13 having a main surface 13*a* forming a finite angle with a reference plane Sc orthogonal to a reference axis Cx extending in a c-axis direction of the group III nitride semiconductor and an active layer 17 of a quantum-well structure, disposed on the main surface 13*a* of the group III nitride semiconductor substrate 13, including a well layer 28 made of a group III nitride semiconductor and a plurality of barrier layers 29 made of a group III nitride semiconductor. The main surface 13*a* exhibits semipolarity. The active layer 17 has an oxygen content of at least $1\times10^{17}$ $cm^{-3}$ but not exceeding $8\times10^{17}$ $cm^{-3}$. The plurality of barrier layers 29 contain an n-type impurity other than oxygen by at least $1\times10^{17}$ $cm^{-3}$ but not exceeding $1\times10^{19}$ $cm^{-3}$ in an upper near-interface area 29*u* in contact with a lower interface 28Sd of the well layer 28 on the group III nitride semiconductor substrate side.

18 Claims, 15 Drawing Sheets

(56) References Cited

U.S. PATENT DOCUMENTS

| | | | |
|---|---|---|---|
| 2008/0017952 A1* | 1/2008 | Cody et al. | 257/613 |
| 2008/0315245 A1 | 12/2008 | Oshima | |
| 2009/0310640 A1* | 12/2009 | Sato et al. | 372/45.011 |

FOREIGN PATENT DOCUMENTS

| | | | |
|---|---|---|---|
| JP | 11-298090 A | | 10/1999 |
| JP | 2000133883 A | * | 5/2000 |
| JP | 2001-102629 A | | 4/2001 |
| JP | 2002-084038 A | | 3/2002 |
| JP | 3955367 A | | 5/2007 |
| JP | 2007-153664 A | | 6/2007 |
| JP | 2009-043970 A | | 2/2009 |
| KR | 10-2007-0078382 A | | 7/2007 |
| KR | 10-2008-0049622 A | | 6/2008 |

* cited by examiner

Fig.6

| | COMPARATIVE EXAMPLE 1 | EXAMPLE 1 | EXAMPLE 2 | COMPARATIVE EXAMPLE 2 |
|---|---|---|---|---|
| CH$_3$SiH$_3$ FLOW (sccm) | 0 | 0.2 | 1 | 10 |
| Si CONTENT IN BARRIER LAYERS (cm$^{-3}$) | <DL | $2.5 \times 10^{17}$ | $1.2 \times 10^{18}$ | $1.5 \times 10^{19}$ |
| SURFACE ROUGHNESS (nm) (Rms, 5 μm RANGE) | 0.8 | 0.3 | 0.4 | 1.2 |

Fig.9

| | COMPARATIVE EXAMPLE 3 | EXAMPLE 3 | EXAMPLE 4 | EXAMPLE 5 | COMPARATIVE EXAMPLE 4 |
|---|---|---|---|---|---|
| CH₃SiH₃ FLOW (sccm) | 0 | 0.2 | 0.5 | 1 | 10 |
| Si CONTENT IN BARRIER LAYERS (cm$^{-3}$) | <DL | $2.5 \times 10^{17}$ | $6.0 \times 10^{17}$ | $1.2 \times 10^{18}$ | $1.5 \times 10^{19}$ |
| DRIVING VOLTAGE (V) @5mW | 10.8 | 7.2 | 6.4 | 5.7 | 5.4 |
| THRESHOLD CURRENT (mA) | 350 | 280 | 240 | 250 | 480 |

Fig.11

| | COMPARATIVE EXAMPLE 5 | EXAMPLE 6 | EXAMPLE 7 |
|---|---|---|---|
| $CH_3SiH_3$ FLOW(sccm) | 0 | 1 | 5 |
| Si CONTENT IN BARRIER LAYERS ($cm^{-3}$) | <DL | $1.2 \times 10^{18}$ | $6.1 \times 10^{18}$ |
| DARK SPOT DENSITY ($cm^{-2}$) | $2.0 \times 10^6$ | $3.0 \times 10^5$ | $8.0 \times 10^4$ |
| LED OUTPUT (mW) @500mA | 11 | 14 | 15 |

*Fig.12*
(a)
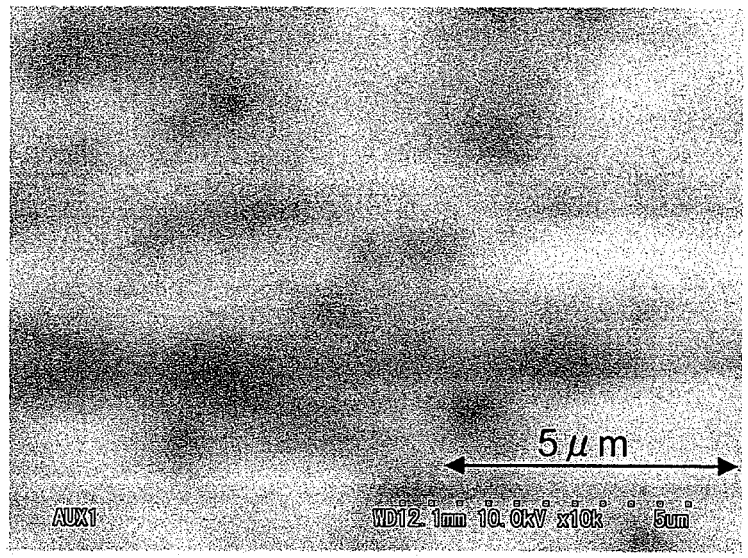
(b)
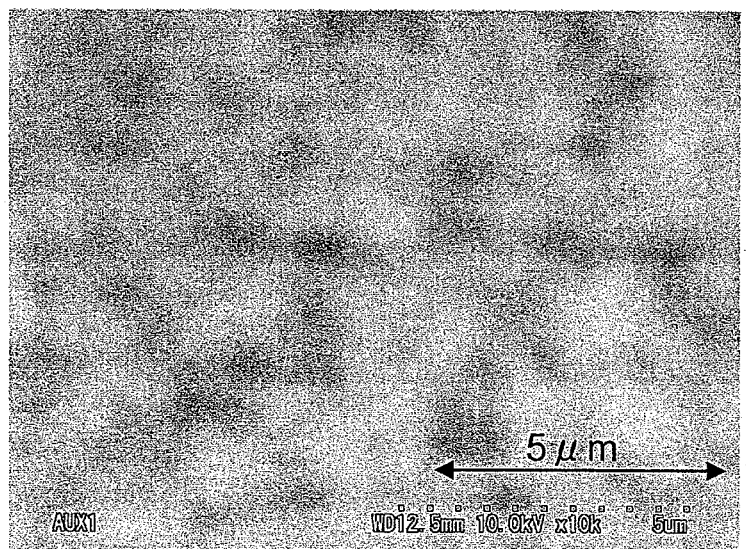

*Fig.14*

|  | COMPARATIVE EXAMPLE 6 | COMPARATIVE EXAMPLE 7 |
|---|---|---|
| Si CONTENT IN BARRIER LAYERS ($cm^{-3}$) | BACKGROUND LEVEL | $1.0 \times 10^{18}$ |
| PL WAVELENGTH (nm) | 467 | 449 |
| PL INTENSITY (a.u.) | 950 | 530 |

Fig.15
(a)
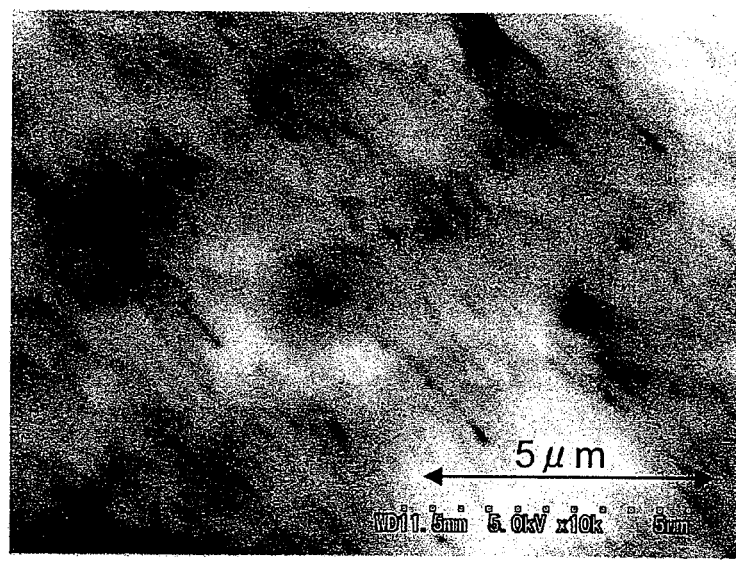
(b)
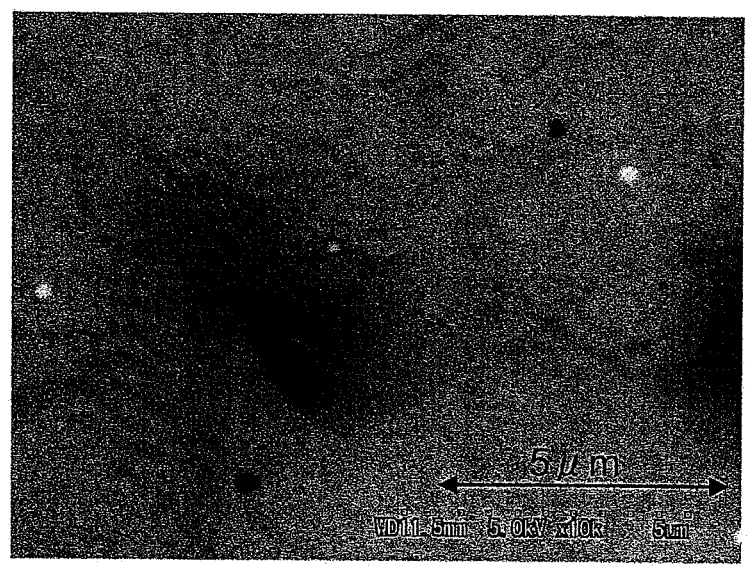

GROUP III NITRIDE SEMICONDUCTOR OPTICAL DEVICE

TECHNICAL FIELD

The present invention relates to a group III nitride semiconductor optical device.

BACKGROUND ART

The following Patent Literatures 1 to 3 disclose nitride semiconductor devices each having an active layer of a multi-quantum-well structure. In these nitride semiconductor devices, a barrier layer of the active layer contains n-type impurities. This is stated to make it possible to lower the lasing threshold and elongate the device life in the nitride semiconductor device of Patent Literature 1, reduce the forward voltage without deteriorating device characteristics in the nitride semiconductor device of Patent Literature 2, and improve the reverse voltage resistance in the nitride semiconductor device of Patent Literature 3.

The following Patent Literature 4 discloses a method for manufacturing a light-emitting semiconductor device including a group III nitride light-emitting layer. For reducing the magnitude of piezoelectric fields, in this method, the above-mentioned group III nitride light-emitting layer and the like is grown on a substrate in which a semipolar surface tilted from a c-plane is used as a main surface.

CITATION LIST

Patent Literature

Patent Literature 1: Japanese Patent Application Laid-Open No. 11-298090
Patent Literature 2: Japanese Patent Application Laid-Open No. 2001-102629
Patent Literature 3: Japanese Patent Application Laid-Open No. 2002-84038
Patent Literature 4: Japanese Patent Publication No. 3955367

SUMMARY OF INVENTION

Technical Problem

Known as a group III nitride semiconductor optical device is one in which a semiconductor multilayer body including an active layer and the like is formed on a group III nitride substrate made of gallium nitride (GaN) or the like. When a GaN substrate whose main surface lies in the c-plane is used in such a group III nitride substrate, a relatively large distortion may occur in the active layer. This may cause a problem that the quantum-confined Stark effect is generated by piezoelectric fields, so that electrons and holes are spatially separated from each other, whereby the light-emitting efficiency decreases.

Solution to Problem

As described in Patent Literatures 1 to 3, causing the barrier layer of the active layer to contain n-type impurities can screen the piezoelectric fields. Therefore, a method using a GaN substrate whose main surface lies in the c-plane and causing the barrier layer of the active layer to contain n-type impurities may be considered.

However, the group III nitride semiconductor optical devices using a GaN substrate whose main surface lies in the c-plane have been known to yield high light emission efficiency due to the localized level light emission caused by composition fluctuations in well layers in the active layer. According to the inventors' findings, causing the barrier layer of the active layer to contain n-type impurities in such a group III nitride semiconductor optical device reduces the composition fluctuations in the well layers, thereby lowering the light emission efficiency of the device. Thus, when n-type impurities are contained in the barrier layer of the active layer in the group III nitride semiconductor optical device, device characteristics may deteriorate because of changes in composition fluctuations of the well layers. These make it difficult for the GaN substrate whose main surface lies in the c-plane to yield a group III nitride semiconductor optical device which suppresses the influence of piezoelectric fields and has sufficient characteristics.

For suppressing such adverse effects caused by the piezoelectric fields, a group III nitride semiconductor optical device using a GaN substrate employing a semipolar surface as its main surface has been known as disclosed in the above-mentioned Patent Literature 4.

Forming a semiconductor multilayer on a substrate employing a semipolar surface as its main surface, however, worsens the morphology of each layer in the semiconductor multilayer because of the fact that the c-plane of each layer is easier to grow at the time of growing the semiconductor multilayer. The worsening of the morphology deteriorates the crystal quality of the semiconductor multilayer, thereby making it harder to yield a group III nitride semiconductor device having sufficient characteristics.

It has been known that the morphology of each layer in the semiconductor multilayer can be improved (flattened) when n-type impurities are contained in the barrier layer of the active layer as described in the above-mentioned Patent Literatures 1 to 3 even in the case where the semiconductor multilayer is formed on a substrate employing a semipolar surface as a main surface. However, the crystal quality of the semiconductor multilayer deteriorates when the barrier layer contains n-type impurities in excess, which may make it hard to improve the crystal quality of the semiconductor multilayer sufficiently by simply causing the barrier layer to contain the n-type impurities.

In view of such problems, it is an object of the present invention to provide a group III nitride semiconductor optical device which is inhibited from being influenced by piezoelectric fields and has high crystal quality.

Solution to Problem

For solving the above-mentioned problems, the group III nitride semiconductor optical device in accordance with the present invention comprises a group III nitride semiconductor substrate, made of a group III nitride semiconductor, having a main surface forming a finite angle with a reference plane orthogonal to a reference axis extending in a c-axis direction of the group III nitride semiconductor; and an active layer of a quantum-well structure, disposed on the main surface of the group III nitride semiconductor substrate, including a well layer made of a group III nitride semiconductor and a plurality of barrier layers made of a group III nitride semiconductor; wherein the main surface exhibits semipolarity; wherein the active layer is an epitaxial layer and has an oxygen content of at least $1\times10^{17}$ cm$^{-3}$ but not exceeding $8\times10^{17}$ cm$^{-3}$, and wherein the plurality of barrier layers contain an n-type impurity other than oxygen by at least $1\times10^{17}$ cm$^{-3}$ but not exceeding $1\times10^{19}$ cm$^{-3}$ in a near-interface area in contact with an interface of the well layer on the group III nitride semiconductor substrate side.

Since an active layer is disposed on a group III nitride semiconductor substrate having a main surface exhibiting semipolarity, the group III nitride semiconductor optical device in accordance with the present invention can suppress the influence of piezoelectric fields more than the group III nitride semiconductor optical device in which an active layer is disposed on a group III nitride semiconductor substrate whose main surface lies in the c-plane.

In the group III nitride semiconductor optical device in accordance with the present invention, the barrier layers of the active layer contains an n-type impurity other than oxygen by at least $1\times10^{17}$ cm$^{-3}$ in a near-interface area in contact with an interface of the well layer on the group III nitride semiconductor substrate side. This improves the morphology of the barrier layers, so as to ameliorate the morphology of the well layer epitaxially growing on the near-interface area such as to come into contact with the near-interface area, thereby raising the crystal quality of the active layer as a whole. Since the n-type impurity content in the barrier layers is $1\times10^{19}$ cm$^{-3}$ or less, it will not worsen the morphology of the well layer. According to the inventors' findings, causing the active layer to contain oxygen within the range of at least $1\times10^{17}$ cm$^{-3}$ but not exceeding $8\times10^{17}$ cm$^{-3}$ improves the morphology of each layer in the active layer and raises the crystal quality of the active layer.

While the barrier layers contain both oxygen and the n-type impurity other than oxygen in the group III nitride semiconductor optical device in accordance with the present invention, oxygen and the n-type impurity other than oxygen are taken up at respective sites different from each other within the barrier layers. Specifically, the n-type impurity other than oxygen is taken up at a group III atom site in the group III nitride semiconductor constituting the barrier layers, while oxygen is taken up at a nitrogen site in the group III nitride semiconductor constituting the barrier layers.

Therefore, when the respective contents of the n-type impurity other than oxygen and oxygen fall within their tolerable ranges capable of improving the morphology of each layer in the active layer if the barrier layers are doped with the n-type impurity other than oxygen or oxygen alone, they can ameliorate the morphology of each layer in the active layer, thereby raising the crystal quality of the active layer. As a result, this can raise the crystal quality of the active layer more than in the case where the morphology of the active layer is improved by doping the barrier layers with only the n-type impurity other than oxygen.

Since the barrier layers are doped with the n-type impurity other than oxygen, there is a possibility of the composition fluctuation in the well layer decreasing in the group III nitride semiconductor optical device. However, disposing the active layer on the group III nitride semiconductor substrate having a main surface exhibiting semipolarity reduces the composition fluctuation in the well layer. Therefore, unlike the group III nitride semiconductor optical device in which the active layer is disposed on a group III nitride semiconductor substrate whose main surface lies in the c-plane, the composition fluctuation is originally small in the well layer, whereby device characteristics are inhibited from being changed by the fact that the composition fluctuation in the well layer becomes smaller.

Because of the foregoing, the group III nitride semiconductor optical device in accordance with the present invention can suppress the influence of piezoelectric fields and raise the crystal quality.

In the group III nitride semiconductor optical device in accordance with the present invention, the n-type impurity contained in the barrier layers may be at least one of silicon, germanium, and tin.

In the group III nitride semiconductor optical device in accordance with the present invention, the plurality of barrier layers may contain the n-type impurity other than oxygen by at least $1\times10^{17}$ cm$^{-3}$ but not exceeding $1\times10^{19}$ cm$^{-3}$ in a near-interface area in contact with the interface of the well layer. This allows the barrier layers to contain the n-type impurity other than oxygen by at least $1\times10^{17}$ cm$^{-3}$ but not exceeding $1\times10^{19}$ cm$^{-3}$ in all the near-interface areas in contact with the interface of the well layer. This further improves the morphology of the barrier layers, thereby further ameliorating the morphology of each layer of the active layer. As a result, the crystal quality of the device becomes further higher.

In the group III nitride semiconductor optical device in accordance with the present invention, the plurality of barrier layers may contain the n-type impurity other than oxygen by at least $1\times10^{17}$ cm$^{-3}$ but not exceeding $1\times10^{19}$ cm$^{-3}$ throughout the thickness thereof. This further improves the morphology of the barrier layers, thereby further ameliorating the morphology of each layer of the active layer. As a result, the crystal quality of the device becomes further higher.

In the group III nitride semiconductor optical device in accordance with the present invention, the content of the n-type impurity may be at least $5\times10^{17}$ cm$^{-3}$. This can inhibit dislocations from occurring in the well layer in particular.

In the group III nitride semiconductor optical device in accordance with the present invention, the content of the n-type impurity may be at least $1\times10^{18}$ cm$^{-3}$. This can lower the operating voltage of the group III nitride semiconductor optical device in particular.

In the group III nitride semiconductor optical device in accordance with the present invention, a normal vector indicating a direction normal to the main surface and a reference vector indicating a direction of the reference axis may form an angle falling within any of ranges of at least 10° but not exceeding 80° and at least 100° but not exceeding 170°. In this case, the main surface and the reference plane also form an angle falling within any of ranges of at least 10° but not exceeding 80° and at least 100° but not exceeding 170°. As a consequence, the main surface becomes a surface tilted from an m-plane or a-plane which is a stable plane of the group III nitride semiconductor. This can suppress the composition fluctuation in the well layer, thereby inhibiting dislocations from occurring in the well layer.

In the group III nitride semiconductor optical device in accordance with the present invention, the normal vector and the reference vector may form an angle falling within any of ranges of at least 63° but not exceeding 80° and at least 100° but not exceeding 117°. In this case, the main surface and the reference plane also form an angle falling within any of ranges of at least 63° but not exceeding 80° and at least 100° but not exceeding 117°. As a consequence, the main surface becomes a surface tilted from a {10-11} plane which is a stable plane of the group III nitride semiconductor. This can suppress the composition fluctuation in the well layer in particular, thereby inhibiting dislocations from occurring in the well layer in particular.

In the group III nitride semiconductor optical device in accordance with the present invention, the normal vector and the reference vector may form an angle falling within any of ranges of at least 71° but not exceeding 79° and at least 101° but not exceeding 109°. In this case, the main surface and the reference plane also form an angle falling within any of ranges of at least 71° but not exceeding 79° and at least 101° but not exceeding 109°. This can further suppress the composition fluctuation in the well layer, thereby inhibiting dislocations from occurring in the well layer in particular and enhancing the group III element uptake efficiency in the well layer, which is advantageous in particular when the group III nitride semiconductor optical device of the present invention is employed as a semiconductor optical device for a long wavelength (ranging from blue to green in color).

In the group III nitride semiconductor optical device in accordance with the present invention, the normal vector may lie in a direction obtained by rotating the reference vector about an a-axis of the group III nitride semiconductor. In this case, the main surface is a semipolar surface obtained by tilting the reference plane in an m-axis direction of the group III nitride semiconductor.

In this case, the main surface and the a-plane may form an angle of at least 87° but not exceeding 93°. Here, the main surface is a semipolar surface obtained by tilting the reference plane in the m-axis direction of the group III nitride semiconductor and further by a minute angle, i.e., a finite angle within the range of at least −3° but not exceeding +3°, with respect to the a-axis direction. This improves the morphology of the barrier layers containing the n-type impurity other than oxygen in particular.

In the group III nitride semiconductor optical device in accordance with the present invention, the normal vector may lie in a direction obtained by rotating the reference vector about the m-axis of the group III nitride semiconductor. In this case, the main surface is a semipolar surface obtained by tilting the reference plane in the a-axis direction of the group III nitride semiconductor.

In this case, the main surface and the m-plane may form an angle of at least 87° but not exceeding 93°. Here, the main surface is a semipolar surface obtained by tilting the reference plane in the a-axis direction of the group III nitride semiconductor and further by a minute angle, i.e., a finite angle within the range of at least −3° but not exceeding +3°, with respect to the m-axis direction. This improves the morphology of the barrier layers containing the n-type impurity other than oxygen in particular.

In the group III nitride semiconductor optical device in accordance with the present invention, the main surface may be a {20-21} plane. This can further suppress the composition fluctuation in the well layer, thereby inhibiting dislocations from occurring in the well layer in particular and enhancing the group III element uptake efficiency in the well layer, which is advantageous in particular when the group III nitride semiconductor optical device of the present invention is employed as a semiconductor optical device for a long wavelength (ranging from blue to green in color).

In the group III nitride semiconductor optical device in accordance with the present invention, the main surface may be a {20-2-1} plane. This can further suppress the composition fluctuation in the well layer. In addition, the group III element uptake efficiency in the well layer becomes higher when the {20-2-1} plane, which corresponds to the rear side of the {20-21} plane, is used as the main surface than when the {20-21} plane is used as the main surface, thereby making it more advantageous when the group III nitride semiconductor optical device of the present invention is employed as a semiconductor optical device for a long wavelength (ranging from blue to green in color).

In the group III nitride semiconductor optical device in accordance with the present invention, the dislocation density through the active layer may be $1 \times 10^6$ cm$^{-2}$ or less. This can secure sufficient reliability also when the group III nitride semiconductor optical device of the present invention is employed as a semiconductor optical device whose emission wavelength falls within a green region.

In the group III nitride semiconductor optical device in accordance with the present invention, the dislocation density through the active layer may be $1 \times 10^5$ cm$^{-2}$ or less. This can secure sufficient reliability also when the group III nitride semiconductor optical device of the present invention is employed as a laser device.

The group III nitride semiconductor optical device in accordance with the present invention may further comprise a first semiconductor layer of a first conduction type made of a group III nitride semiconductor layer and a second semiconductor layer of a second conduction type made of a group III nitride semiconductor layer; wherein a normal to the main surface and the reference axis form an angle falling within any of ranges of at least 63° but not exceeding 80° and at least 100° but not exceeding 117°; wherein the first semiconductor layer is disposed between the group III nitride semiconductor substrate and the active layer; wherein the active layer is disposed between the first and second semiconductor layers; wherein the active layer includes a plurality of well layers; and wherein a semiconductor layer containing an n-type impurity other than oxygen exists between the well layer located closest to the second semiconductor layer in the plurality of well layers and the second semiconductor layer.

When the normal to the main surface and the reference axis form an angle falling within the range mentioned above, the piezoelectric field in the active layer is directed opposite to the piezoelectric field in the group III nitride semiconductor substrate. Therefore, dips are harder to form in a valence band between the well layer located closest to the second semiconductor layer and the second semiconductor layer. Therefore, electron overflow is harder to occur even when a semiconductor layer containing the n-type impurity other than oxygen is disposed between the well layer located closest to the second semiconductor layer and the second semiconductor layer. Providing such a semiconductor layer containing an n-type impurity can lower the operating voltage of the group III nitride semiconductor optical device in particular. Hence, the operating voltage can be lowered, while the electron overflow is suppressed.

Advantageous Effects of Invention

The present invention provides a group III nitride semiconductor optical device which is inhibited from being influenced by piezoelectric fields and has high crystal quality.

BRIEF DESCRIPTION OF DRAWINGS

FIG. 6 is a chart listing the monomethylsilane gas flow rate at the time of growing barrier layers, Si content in the barrier layers, and surface roughness in each of Examples 1 and 2 and Comparative Examples 1 and 2;

FIG. 9 is a chart listing the monomethylsilane gas flow rate at the time of growing barrier layers, Si content in the barrier layers, LD driving voltage, and LD threshold current in each of Examples 3, 4, and 5 and Comparative Examples 3 and 4;

FIG. 11 is a chart listing the monomethylsilane gas flow rate at the time of growing barrier layers, Si content in the barrier layers, dark spot density, and LED output in each of Examples 6 and 7 and Comparative Example 5;

FIG. 12 is a view illustrating CL images of Comparative Examples 5 and 6;

FIG. 14 is a chart listing the Si content in the barrier layers, PL wavelength, and PL intensity in each of Comparative Examples 6 and 7; and FIG. 15 is a view illustrating light emission images of Comparative Examples 6 and 7 by a cathodoluminescence method.

DESCRIPTION OF EMBODIMENTS

Figure 1:
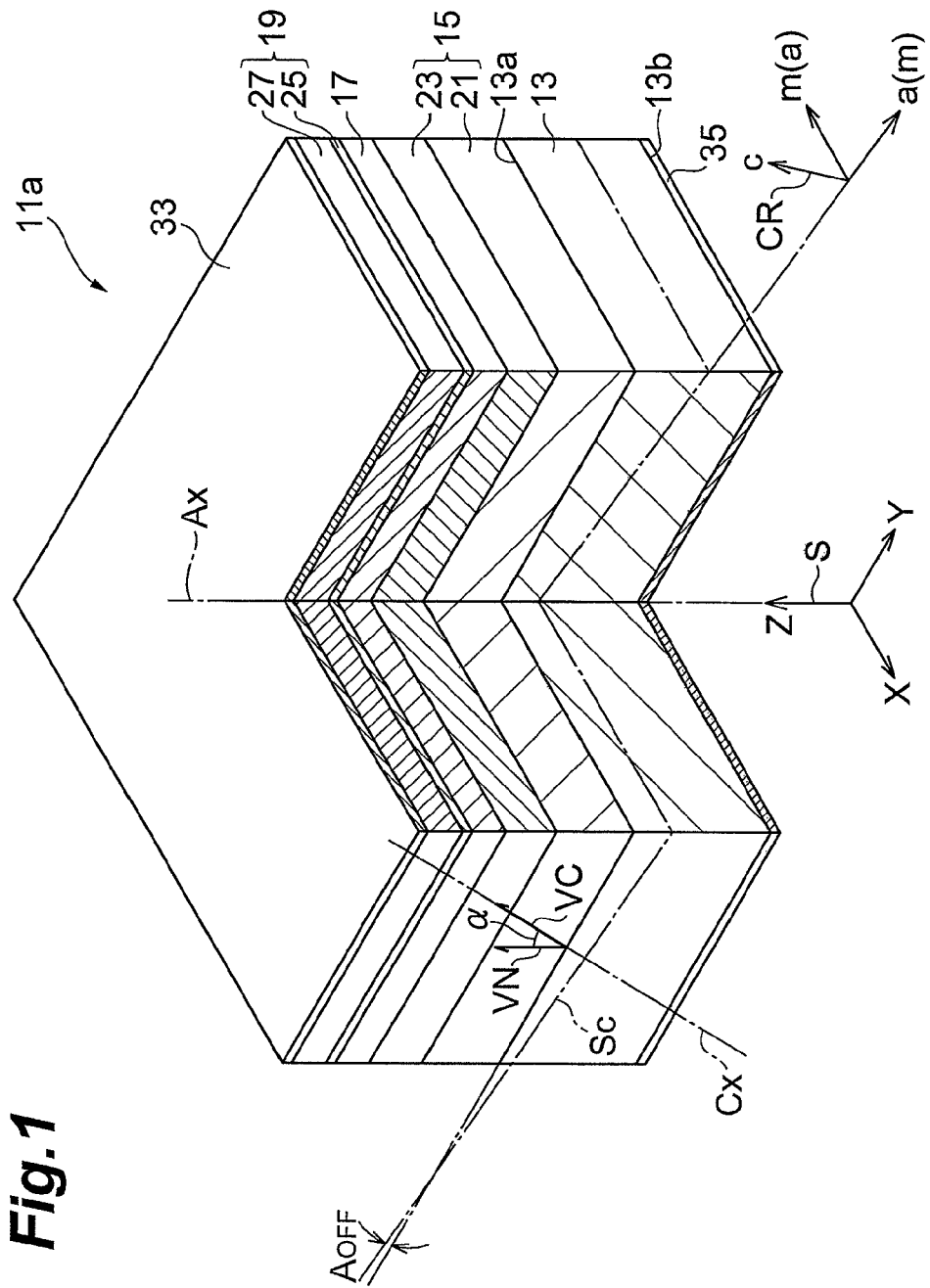
FIG. 1 is a view schematically illustrating the group III nitride semiconductor optical device in accordance with an embodiment.

In the following, the group III nitride semiconductor optical device in accordance with an embodiment will be explained in detail with reference to the drawings. In the drawings, the same constituents will be referred to with the same signs when possible. Ratios of dimensions within and between constituents in the drawings are arbitrary in order to make the drawings easier to see.

FIG. 1 is a view schematically illustrating the group III nitride semiconductor optical device in accordance with the embodiment. The group III nitride semiconductor optical device in accordance with this embodiment has a structure employable in a light-emitting diode, for example. As illustrated in FIG. 1, this group III nitride semiconductor optical device 11a comprises a group III nitride semiconductor substrate 13, a group III nitride semiconductor area 15, an active layer 17, and a group III nitride semiconductor area 19. The group III nitride semiconductor substrate 13 is made of a group III nitride semiconductor such as GaN, InGaN, or AlGaN, for example. The group III nitride semiconductor substrate 13 has a main surface 13a and a rear surface 13b. The main surface 13a of the group III nitride semiconductor substrate 13 exhibits semipolarity.

FIG. 1 illustrates a crystal coordinate system CR constituted by a-, m-, and c-axes in hexagonal crystal axes of a group III nitride semiconductor. For example, the c-plane in a hexagonal crystal is expressed as "(0001)", while the surface orientation expressed as "(000-1)" is directed opposite to the (0001) plane. FIG. 1 also illustrates an orthogonal coordinate system S constituted by geometrical coordinate axes X, Y, and Z. In the orthogonal coordinate system S, X and Y axes are set in directions parallel to the main surface 13a, while the Z axis is set in a thickness direction of the group III nitride semiconductor substrate 13.

Since the group III nitride semiconductor substrate 13 has the semipolar main surface 13a, the main surface 13a of the group III nitride semiconductor substrate 13 is tilted with respect to a reference plane Sc which is orthogonal to a reference axis Cx. Here, the reference axis Cx extends in the c-axis direction of the group III nitride semiconductor.

The reference plane Sc is orthogonal to the reference axis Cx and thus is a plane parallel to the c-plane of the group III nitride semiconductor. FIG. 1 illustrates a reference vector VC oriented in the c-axis direction and a normal vector VN oriented in the direction normal to the main surface 13a. The normal vector VN and the reference vector VC form an angle α which equals an angle $A_{OFF}$ formed between the main surface 13a and the reference plane Sc. This angle $A_{OFF}$ is referred to as an off angle of the group III nitride semiconductor substrate 13 with respect to the c-plane.

The group III nitride semiconductor area 15, active layer 17, and group III nitride semiconductor area 19, which are epitaxial layers, are arranged on the main surface 13a along an axis Ax parallel to the Z axis.

The group III nitride semiconductor area 15 is disposed on the main surface 13a. The group III nitride semiconductor area 15 may include one or a plurality of group III nitride semiconductor layers. In this embodiment, the group III nitride semiconductor area 15 is constituted by a first conduction type group III nitride semiconductor layer 21 (first semiconductor layer) and a group III nitride semiconductor layer 23. The first conduction type group III nitride semiconductor layer 21 may be an n-type semiconductor layer, for example, while the group III nitride semiconductor layer 23 may be a buffer layer, for example. The first conduction type group III nitride semiconductor layer 21 is made of an n-type gallium-nitride-based semiconductor, for example, which is doped with an n-type dopant such as silicon, for example. The n-type gallium-nitride-based semiconductor may be made of GaN, AlGaN, InGaN, InAlGaN, or the like, for example. The group III nitride semiconductor layer 23 is constituted by an undoped gallium-nitride-based semiconductor, for example. The gallium-nitride-based semiconductor may be made of InGaN, InAlGaN, GaN, or the like, for example.

The group III nitride semiconductor area 19 may include one or a plurality of group III nitride semiconductor layers. In this embodiment, the group III nitride semiconductor area 19 is constituted by a group III nitride semiconductor layer 25 and a second conduction type group III nitride semiconductor layer 27 (second semiconductor layer). The group III nitride semiconductor layer 25 may be made of an undoped or p-type gallium-nitride-based semiconductor, for example. The second conduction type group III nitride semiconductor layer 27 is made of a p-type gallium-nitride-based semiconductor, for example, which is doped with a p-type dopant such as magnesium, for example. The p-type gallium-nitride-based semiconductor may be made of GaN, AlGaN, InAlGaN, InGaN, or the like, for example. The group III nitride semiconductor layer 25 may be an electron blocking layer, for example, while the second conduction type group III nitride semiconductor layer 27 may be a p-type contact layer, for example. The active layer 17 is disposed between the first conduction type group III nitride semiconductor layer 21 and the second conduction type group III nitride semiconductor layer 27. The active layer 17 is disposed on the group III nitride semiconductor area 15, while the group III nitride semiconductor area 19 is disposed on the active layer 17.

The group III nitride semiconductor area 15, active layer 17, and group III nitride semiconductor area 19 have an oxygen content of at least $1 \times 10^{17}$ cm$^{-3}$ but not exceeding $8 \times 10^{17}$ cm$^{-3}$. This oxygen content can be controlled by the content of impurities such as water in materials, off angle of the substrate, growth temperature, compositions of mixed crystals, and the like at the time of epitaxially growing the group III nitride semiconductor area 15, active layer 17, and group III nitride semiconductor area 19, for example. Though all of the group III nitride semiconductor area 15, active layer 17, and group III nitride semiconductor area 19 have an oxygen content of at least $1\times10^{17}$ cm$^{-3}$ but not exceeding $8\times10^{17}$ cm$^{-3}$ in this embodiment, it will be sufficient if at least the active layer 17 has an oxygen content of at least $1\times10^{17}$ cm$^{-3}$ but not exceeding $8\times10^{17}$ cm$^{-3}$.

Figure 2:
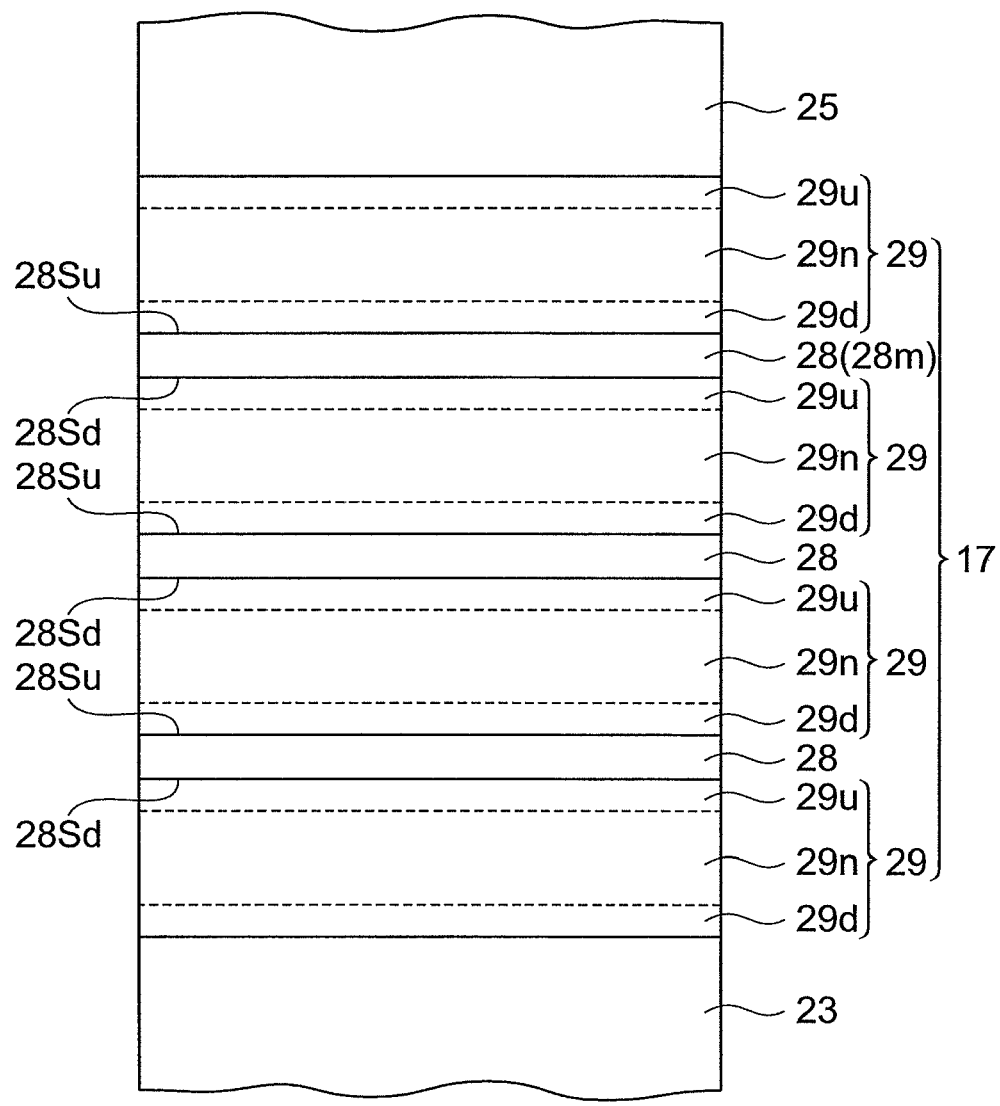
FIG. 2 is a view illustrating a cross-sectional structure near an active layer of the group III nitride semiconductor optical device.

The active layer 17 will now be explained in detail with reference to FIG. 2. FIG. 2 is a view illustrating a cross-sectional structure near the active layer of the group III nitride semiconductor optical device.

The active layer 17 of the group III nitride semiconductor optical device 11a may have a multi-quantum-well structure including well layers 28 and barrier layers 29 which are arranged alternately. The lowermost barrier layer 29 is in contact with the group III nitride semiconductor layer 23, while the uppermost barrier layer 29 is in contact with the group III nitride semiconductor layer 25. The well layers 28 may be made of group III nitride semiconductors such as GaN, AlGaN, InGaN, and InAlGaN, for example, while the barrier layers 29 may be made of group III nitride semiconductors such as GaN, AlGaN, InGaN, and InAlGaN, for example. The active layer 17 may have a single-quantum-well structure constituted by one well layer 28 and two barrier layers 29. The lowermost and uppermost barrier layers 29 may be omitted. In this case, the lowermost well layer 28 is in contact with the group III nitride semiconductor layer 23, while the uppermost well layer 28 is in contact with the group III nitride semiconductor layer 25.

Each well layer 28 has a lower interface 28Sd on the group III nitride semiconductor substrate 13 side and an upper interface 28Su on the side opposite to the group III nitride semiconductor substrate 13. Each barrier layer 29 has a lower near-interface area 29d on the semiconductor substrate 13 side, an upper near-interface area 29u on the side opposite to the semiconductor substrate 13, and an intermediate area 29n between the lower near-interface area 29d and the upper near-interface area 29u. The upper interface 28Su of the well layer 28 is in contact with the lower near-interface area 29d of the barrier layer 29, while the lower interface 28Sd of the well layer 28 is in contact with the upper near-interface area 29u of the barrier layer 29.

The barrier layer 29 contains an n-type impurity other than oxygen by at least $1\times10^{17}$ cm$^{-3}$ but not exceeding $1\times10^{19}$ cm$^{-3}$ in at least the upper near-interface area 29u in contact with the lower interface 28Sd of the well layer 28. As the n-type impurity other than oxygen, a group IV element may be used, for example. At least one of silicon, germanium (Ge), and tin (Sn), for example, may be used as the group IV element. When the n-type dopant is silicon, monomethylsilane (CH$_3$SiH$_3$), monosilane, disilane, tetraethylsilane, or the like may be used as a doping gas. When the n-type dopant is germanium, monogermane, tetraethylgermanium, or the like may be used as a doping gas. When the n-type dopant is tin, tetraethyltin, tetramethyltin, or the like may be used as a doping gas.

The group III nitride semiconductor optical device in accordance with a modified example of this embodiment will now be explained. The explanation of this modified example includes a part in which constituents similar to those of the above-mentioned group III nitride semiconductor optical device 11a are referred to with the same signs and thus are not described in detail.

Figure 3:
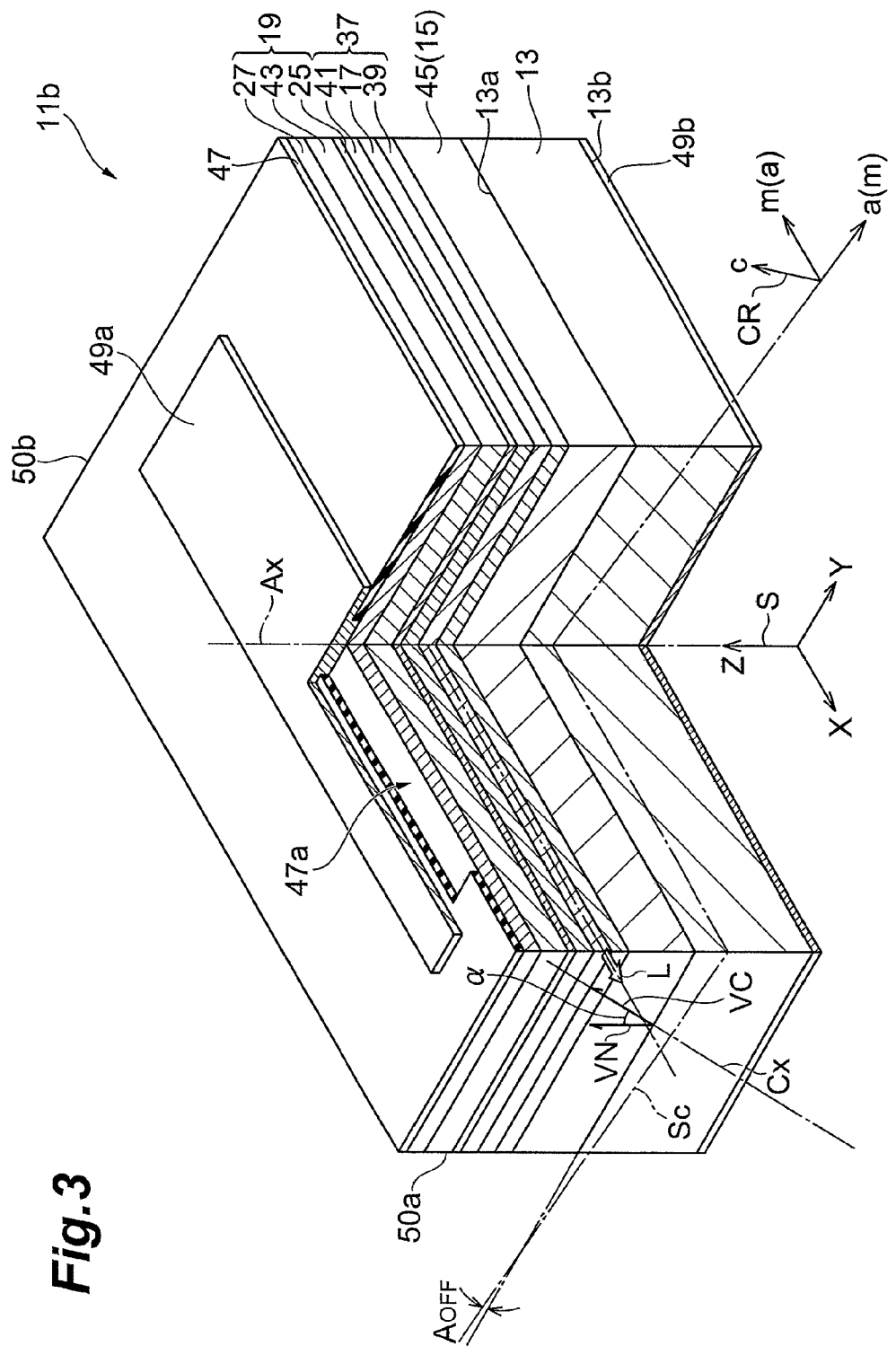
FIG. 3 is a view schematically illustrating the group III nitride semiconductor optical device in accordance with a modified example of the embodiment.

FIG. 3 is a view schematically illustrating the group III nitride semiconductor optical device in accordance with the modified example of the embodiment. The group III nitride semiconductor optical device in accordance with the modified example has a structure employable in a semiconductor laser, for example. As illustrated in FIG. 3, this group III nitride semiconductor optical device 11b comprises a group III nitride semiconductor substrate 13, a group III nitride semiconductor area 15, a light-emitting layer 37, and a group III nitride semiconductor area 19. In this modified example, the light-emitting layer 37 may include an active layer 17, a first light guiding layer 39, and a second light guiding layer 41. The active layer 17 is disposed between the first and second light guiding layers 39, 41. The first and second light guiding layers 39, 41 are made of a group III nitride semiconductor, which may be undoped, for example. Alternatively, the first and second light guiding layers 39, 41 may be made of n- and p-type nitride semiconductors, respectively.

In addition to the group III nitride semiconductor layer 25 and second conduction type group III nitride semiconductor layer 27, the group III nitride semiconductor area 19 may include another second conduction type group III nitride semiconductor layer 43. The second conduction type group III nitride semiconductor layer 43 is made of a p-type gallium-nitride-based semiconductor, for example, which is doped with a p-type dopant such as magnesium, for example. The p-type gallium-nitride-based semiconductor may be made of GaN, AlGaN, InAlGaN, or the like, for example. The second conduction type group III nitride semiconductor layer 43 may be a p-type cladding layer, for example.

The group III nitride semiconductor area 15 may include a group III nitride semiconductor layer 45. The group III nitride semiconductor layer 45 is made of an n-type gallium-nitride-based semiconductor, for example, which is doped with an n-type dopant such as silicon, for example. The n-type gallium-nitride-based semiconductor may be made of GaN, AlGaN, InAlGaN, or the like, for example. The group III nitride semiconductor layer 45 may be an n-type cladding layer, for example.

The light-emitting layer 37 is disposed between the group III nitride semiconductor layer 45 and the second conduction type group III nitride semiconductor layer 43. The refractive index of the group III nitride semiconductor layer 45 and second conduction type group III nitride semiconductor layer 43 is lower than that of the first and second light guiding layers 39, 41. The group III nitride semiconductor layer 45 and the second conduction type group III nitride semiconductor layer 43 confine light into the light-emitting layer 37.

In the group III nitride semiconductor optical device 11b, an insulating film 47 for protection is disposed on the second conduction type group III nitride semiconductor layer 27. The insulating film 47 has a stripe-shaped opening 47a. A first electrode (e.g., anode) 49a is disposed on the insulating film 47 and the opening 47a. A second electrode (e.g., cathode) 49b is disposed on the rear surface 13b of the group III nitride semiconductor substrate 13.

This group III nitride semiconductor optical device 11b has a structure of a gain-guided laser diode, for example. The group III nitride semiconductor optical device 11b may have a pair of end surfaces 50a, 50b. Preferably, the end surfaces 50a, 50b are cut cross sections in order to form a cavity. Laser light L caused by the group III nitride semiconductor optical device 11b is emitted from one of the end surfaces 50a, 50b.

Since the active layer 17 is disposed on the group III nitride semiconductor substrate 13 having the main surface 13a exhibiting semipolarity, the group III nitride semiconductor optical devices 11a, 11b in accordance with this embodiment as mentioned above can suppress the influence of piezoelectric fields more than the group III nitride semiconductor optical device in which the active layer 17 is disposed on a group III nitride semiconductor substrate whose main surface lies in the c-plane.

As mentioned above, in the group III nitride semiconductor optical devices 11a, 11b in accordance with this embodiment, each barrier layer 29 in the active layer 17 contains an n-type impurity other than oxygen by at least $1 \times 10^{17}$ cm$^{-3}$ in at least the upper near-interface area 29u in contact with the lower interface 28Sd on the group III nitride semiconductor substrate 13 side of the well layer 28. This improves the morphology of the barrier layer 29, so as to ameliorate the morphology of the well layer 28 epitaxially growing on the upper near-interface area 29u such as to come into contact with the upper near-interface area 29u, thereby raising the crystal quality of the active layer 17 as a whole. When the content of the n-type impurity other than oxygen is less than $1 \times 10^{17}$ cm$^{-3}$, the morphology of the well layer 28 may not be improved sufficiently. When the n-type impurity content in the barrier layer 29 is greater than $1 \times 10^{19}$ cm$^{-3}$, it may be in excess, so as to worsen the morphology of the barrier layer 29 on the contrary, thereby deteriorating the morphology of the well layer 28.

According to the inventors' findings, causing the active layer 17 to contain oxygen within the range of at least $1 \times 10^{17}$ cm$^{-3}$ but not exceeding $8 \times 10^{17}$ cm$^{-3}$ can inhibit the c-plane from occurring at the time of growing the active layer 17, thereby stabilizing the generation of non-c-planes. This improves the morphology of each layer (well layers 28 and barrier layers 29) in the active layer 17 and raises the crystal quality of the active layer 17. When the oxygen content is less than $1 \times 10^{17}$ cm$^{-3}$, the morphology of each layer of the active layer 17 may not be improved sufficiently. When the oxygen content exceeds $8 \times 10^{17}$ cm$^{-3}$, the morphology of each layer in the active layer 17 may become worse on the contrary, thereby deteriorating the morphology of the active layer 17.

While the barrier layers 29 contain both the n-type impurity other than oxygen and oxygen in the group III nitride semiconductor optical devices 11a, 11b in accordance with this embodiment as mentioned above, the n-type impurity other than oxygen and oxygen are taken up at respective sites different from each other within the barrier layers 29. Specifically, the n-type impurity other than oxygen is taken up at a group III atom site (e.g., Ga site) in the group III nitride semiconductor constituting the barrier layers 29, while oxygen is taken up at a nitrogen site in the group III nitride semiconductor constituting the barrier layers 29.

Therefore, doping of the barrier layers 29 with oxygen and doping of the barrier layers 29 with the n-type impurity other than oxygen are harder to interfere with each other. Specifically, when the respective contents of the n-type impurity other than oxygen and oxygen fall within their tolerable ranges capable of improving the morphology of each layer in the active layer 17 if the barrier layers 29 are doped with the n-type impurity other than oxygen or oxygen alone, they can ameliorate the morphology of each layer in the active layer 17, thereby raising the crystal quality of the active layer 17.

Since the barrier layers 29 are doped with the n-type impurity other than oxygen, there is a possibility of the composition fluctuation in the well layers 28 decreasing in the group III nitride semiconductor optical devices 11a, 11b in accordance with this embodiment. However, disposing the active layer 17 on the group III nitride semiconductor substrate 13 having the main surface 13a exhibiting semipolarity reduces the composition fluctuation of the well layers 28. Therefore, unlike the group III nitride semiconductor optical device in which the active layer is disposed on a group III nitride semiconductor substrate whose main surface lies in the c-plane, the composition fluctuation is originally small in the well layers 28, whereby device characteristics are inhibited from being changed by the fact that the composition fluctuation in the well layers 28 becomes smaller.

As in the foregoing, the group III nitride semiconductor optical devices 11a, 11b in accordance with this embodiment as mentioned above can suppress the influence of piezoelectric fields and raise the crystal quality.

In the group III nitride semiconductor optical devices 11a, 11b in accordance with this embodiment as mentioned above, a plurality of barrier layers 29 may contain the n-type impurity other than oxygen by at least $1 \times 10^{17}$ cm$^{-3}$ but not exceeding $1 \times 10^{19}$ cm$^{-3}$ not only in the upper near-interface areas 29u in contact with the lower interfaces 28Sd of the well layers 28 but also in the lower near-interface areas 29d in contact with the upper interfaces 28Su of the well layers 28 (see FIG. 2). In this case, the barrier layers 29 contain the n-type impurity other than oxygen by at least $1 \times 10^{17}$ cm$^{-3}$ but not exceeding $1 \times 10^{19}$ cm$^{-3}$ in all the near-interface areas (upper near-interface areas 29u and lower near-interface areas 29d) in contact with the interfaces of the well layers 28 (lower interfaces 28Sd and upper interfaces 28Su). This further improves the morphology of the barrier layers 29, thereby further ameliorating the morphology of each layer in the active layer 17. As a result, the crystal quality of the group III nitride semiconductor optical devices 11a, 11b becomes further higher.

In the group III nitride semiconductor optical devices 11a, 11b in accordance with this embodiment, a plurality of barrier layers 29 may contain the n-type impurity other than oxygen by at least $1 \times 10^{17}$ cm$^{-3}$ but not exceeding $1 \times 10^{19}$ cm$^{-3}$ throughout the thickness thereof. This further improves the morphology of the barrier layers 29, thereby further ameliorating the morphology of each layer of the active layer 17. As a result, the crystal quality of the group III nitride semiconductor optical devices 11, 11b becomes further higher.

In the group III nitride semiconductor optical devices 11a, 11b in accordance with this embodiment, the content of the n-type impurity other than oxygen in the barrier layers 29 may be at least $5 \times 10^{17}$ cm$^{-3}$. This can inhibit dislocations from occurring in the well layers 28 in particular.

In the group III nitride semiconductor optical devices 11a, 11b in accordance with this embodiment, the content of the n-type impurity other than oxygen may be at least $1 \times 10^{18}$ cm$^{-3}$. This can lower the operating voltage of the group III nitride semiconductor optical devices 11a, 11b in particular.

In the group III nitride semiconductor optical devices 11a, 11b in accordance with this embodiment, the angle α between the normal VN to the main surface 13a and the reference axis Cx may fall within any of ranges of at least 10° but not exceeding 80° and at least 100° but not exceeding 170° (see FIGS. 1 and 3). In this case, the angle $A_{OFF}$ between the main surface 13a and the reference plane Sc also falls within any of ranges of at least 10° but not exceeding 80° and at least 100° but not exceeding 170°. As a consequence, the main surface 13a becomes a surface tilted from an m-plane or a-plane which is a stable plane of the group III nitride semiconductor. This can suppress the composition fluctuation in the well layers 28, thereby inhibiting dislocations from occurring in the well layers 28.

In the group III nitride semiconductor optical devices 11a, 11b in accordance with this embodiment, the angle between the normal to the main surface 13a and the reference axis Cx, i.e., the angle α between the normal vector VN and the reference vector VC, may fall within any of ranges of at least 63° but not exceeding 80° and at least 100° but not exceeding 117° (see FIGS. 1 and 3). In this case, the angle $A_{OFF}$ between the main surface 13a and the reference plane Sc also falls within any of ranges of at least 63° but not exceeding 80° and at least 100° but not exceeding 117°. As a consequence, the main surface 13a becomes a surface tilted from a {10-11} plane which is a stable plane of the group III nitride semiconductor. This can suppress the composition fluctuation in the well layers 28 in particular, thereby inhibiting dislocations from occurring in the well layers 28 in particular.

In the group III nitride semiconductor optical devices 11a, 11b in accordance with this embodiment, the angle between the normal to the main surface 13a and the reference axis Cx, i.e., the angle α between the normal vector VN and the reference vector VC, may fall within any of ranges of at least 71° but not exceeding 79° and at least 101° but not exceeding 109° (see FIGS. 1 and 3). In this case, the angle $A_{OFF}$ between the main surface 13a and the reference plane Sc also falls within any of ranges of at least 71° but not exceeding 79° and at least 101° but not exceeding 109°. This can further suppress the composition fluctuations in the well layers 28, thereby inhibiting dislocations from occurring in the well layers 28 in particular and enhancing the group III element uptake efficiency in the well layers 28, which is advantageous in particular when the group III nitride semiconductor optical devices 11a, 11b are employed as a semiconductor optical device for a long wavelength (ranging from blue to green in color).

In the group III nitride semiconductor optical devices 11a, 11b in accordance with this embodiment, the normal to the main surface 13a may lie in a direction obtained by rotating the reference axis Cx about the a-axis of the group III nitride semiconductor, i.e., the normal vector VN may lie in a direction obtained by rotating the reference vector VC about the a-axis of the group III nitride semiconductor. In this case, the main surface 13a is a semipolar surface obtained by tilting the reference plane Sc in the m-axis direction of the group III nitride semiconductor.

In this case, the main surface 13a and the a-plane (a plane orthogonal to the a-axis) may form an angle of at least 87° but not exceeding 93°. Here, the main surface 13a is a semipolar surface obtained by tilting the reference plane Sc in the m-axis direction of the group III nitride semiconductor and further by a minute angle, i.e., a finite angle within the range of at least −3° but not exceeding +3°, with respect to the a-axis direction. This improves the morphology of the barrier layers 29 containing the n-type impurity other than oxygen in particular.

In the group III nitride semiconductor optical devices 11a, 11b in accordance with this embodiment, the normal to the main surface 13a may lie in a direction obtained by rotating the reference axis Cx about the m-axis of the group III nitride semiconductor, i.e., the normal vector VN may lie in a direction obtained by rotating the reference vector VC about the m-axis of the group III nitride semiconductor. In this case, the main surface 13a is a semipolar surface obtained by tilting the reference plane Sc in the a-axis direction of the group III nitride semiconductor.

In this case, the main surface 13a and the m-plane (a plane orthogonal to the m-axis) may form an angle of at least 87° but not exceeding 93°. Here, the main surface 13a is a semipolar surface obtained by tilting the reference plane Sc in the a-axis direction of the group III nitride semiconductor and further by a minute angle, i.e., a finite angle within the range of at least −3° but not exceeding +3°, with respect to the m-axis direction. This improves the morphology of the barrier layers 29 containing the n-type impurity other than oxygen in particular.

In the group III nitride semiconductor optical devices 11a, 11b in accordance with this embodiment, the main surface 13a may be a {20-21} plane. The {20-21} plane is a main surface in the case where the reference plane Sc is tilted by 75° in the m-axis direction. This can further suppress the composition fluctuation in the well layers 28, thereby inhibiting dislocations from occurring in the well layers 28 in particular and enhancing the group III element uptake efficiency in the well layers 28, which is advantageous in particular when the group III nitride semiconductor optical devices 11a, 11b are employed as a semiconductor optical device for a long wavelength (ranging from blue to green in color).

In the group III nitride semiconductor optical devices 11a, 11b in accordance with this embodiment, the main surface 13a may be a {20-2-1} plane. This can further suppress the composition fluctuation in the well layers 28. In addition, the group III element uptake efficiency in the well layers 28 becomes higher when the {20-2-1} plane, which corresponds to the rear side of the {20-21} plane, is used as the main surface 13a than when the {20-21} plane is used as the main surface 13a, thereby making it more advantageous when the group III nitride semiconductor optical devices 11a, 11b are employed as a semiconductor optical device for a long wavelength (ranging from blue to green in color).

In the group III nitride semiconductor optical devices 11a, 11b in accordance with this embodiment, the dislocation density through the active layer 17 may be $1 \times 10^6$ cm$^{-2}$ or less. This can secure sufficient reliability also when the group III nitride semiconductor optical devices 11a, 11b are employed as a semiconductor optical device whose emission wavelength falls within a green region. Here, the dislocation density through the active layer 17 can be reduced by appropriately selecting the oxygen content in the active layer 17, the content of the n-type impurity other than oxygen in the barrier layers 29, and the like, for example.

In the group III nitride semiconductor optical devices 11a, 11b in accordance with this embodiment, the dislocation density through the active layer may be $1 \times 10^5$ cm$^{-2}$ or less. This can secure sufficient reliability also when the group III nitride semiconductor optical device of the present invention is employed as a laser device. This allows the threading dislocation density to become 1 or less in a light-emitting area (e.g., a ridge part of 2 μm×600 μm) when the group III nitride semiconductor optical devices 11a, 11b in accordance with this embodiment are employed as a laser device. As a result, sufficient reliability can be secured.

In the group III nitride semiconductor optical devices 11a, 11b in accordance with this embodiment, the angle α between the normal vector VN and the reference vector VC falls within any of ranges of at least 63° but not exceeding 80° and at least 100° but not exceeding 117°, while a semiconductor layer containing an n-type impurity other than oxygen may exist between the well layer 28m located closest to the second conduction type group III nitride semiconductor layer 27 among the well layers 28 (see FIG. 2) and the second conduction type group III nitride semiconductor layer 27 (see FIGS. 1 and 3). This can be achieved by causing the barrier layer 29 (uppermost barrier layer) located closest to the second conduction type group III nitride semiconductor layer 27 to contain the n-type impurity other than oxygen or replacing the group III nitride semiconductor layer 25 with a semiconductor layer containing the n-type impurity. This case has the following advantages.

Figure 4:
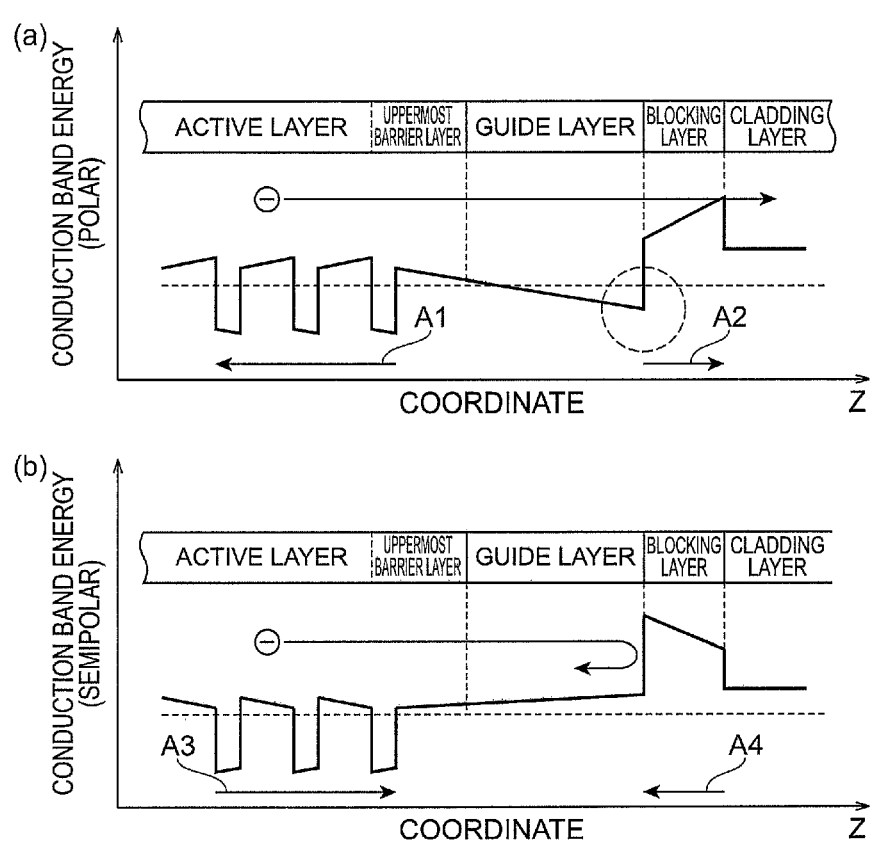
FIG. 4 is a chart illustrating band diagrams in an active layer, a light guiding layer, and a p-type group III nitride semiconductor layer on a polar surface and a semipolar surface.

FIG. 4 is a chart illustrating band diagrams in an active layer, a light guiding layer, and a p-type group III nitride semiconductor layer on a polar surface and a semipolar surface. When the active layer is disposed on the semiconductor substrate whose main surface is a polar surface, as illustrated in FIG. 4(a), the piezoelectric field in the well layers is directed from the second conduction type semiconductor layer to the first conduction type semiconductor layer (in the direction of arrow A1), while the piezoelectric field in a blocking layer is in the opposite direction (the direction of arrow A2), whereby a dip in the valence band is formed between the well layer located closest to a cladding layer and the blocking layer. Doping the uppermost barrier layer or light guiding layer with the n-type impurity in this state further increases the dip in the valence band, thereby enhancing the carrier overflow.

By contrast, when the active layer is disposed on the semiconductor substrate whose main surface is a semipolar surface, as illustrated in FIG. 4(b), the piezoelectric field in the well layers is directed from the first conduction type semiconductor layer to the second conduction type semiconductor layer (in the direction of arrow A3), while the piezoelectric field in the blocking layer is in the opposite direction (the direction of arrow A4), whereby dips in the valence band are hard to form between the well layer 28m located closest to the cladding layer (second conduction type group III nitride semiconductor layer 27) and the blocking layer. Therefore, the electron overflow is hard to occur even when a semiconductor layer containing the n-type impurity other than oxygen is disposed between the well layer 28m located closest to the cladding layer and the blocking layer. Providing such a semiconductor layer containing the n-type impurity can lower the operating voltage of the group III nitride semiconductor optical devices 11a, 11b. Therefore, the operating voltage of the group III nitride semiconductor optical devices 11a, 11b can be lowered while suppressing the electron overflow.

EXAMPLES

Examples and Comparative Examples will now be explained.

Figure 5:
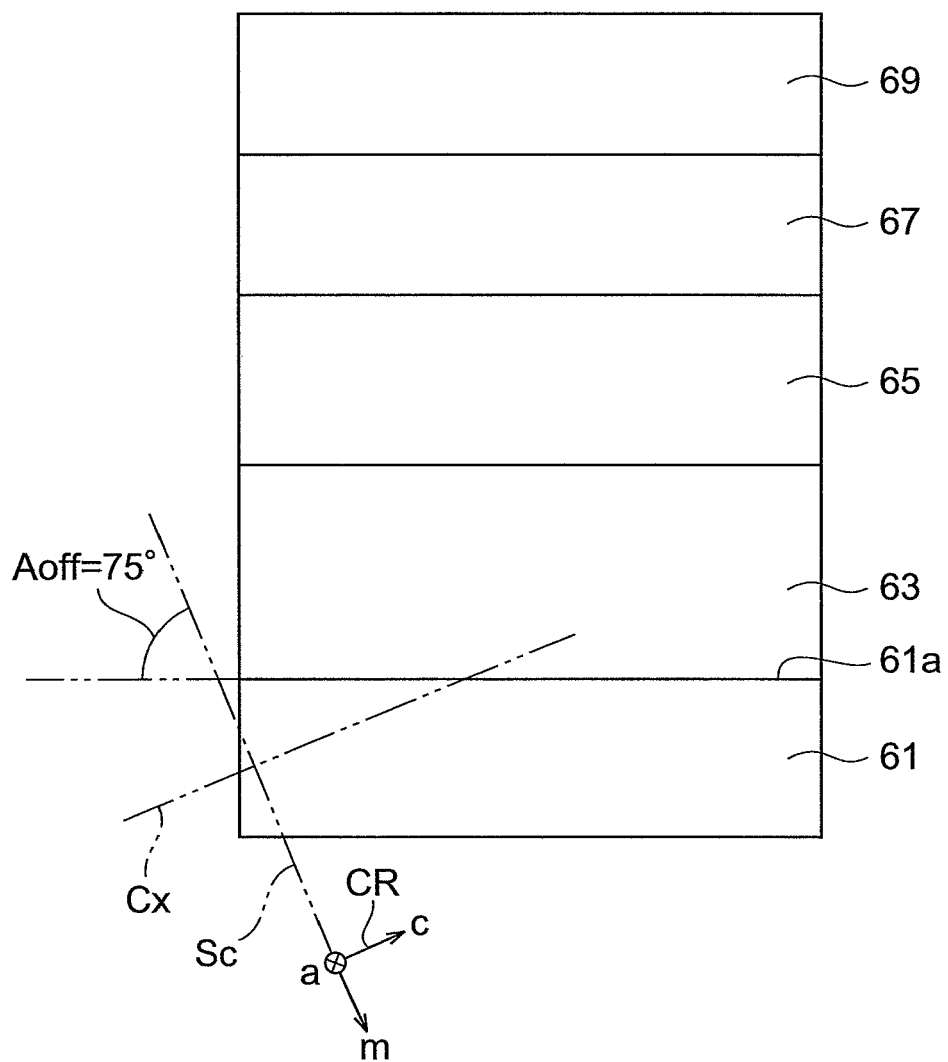
FIG. 5 is a diagram illustrating a semiconductor multilayer body structure of Examples 1 and 2 and Comparative Examples 1 and 2.

Semiconductor multilayers were made as Examples 1 and 2 and Comparative Examples 1 and 2. FIG. 5 is a view showing a semiconductor multilayer structure of Examples 1 and 2 and Comparative Examples 1 and 2. As illustrated in FIG. 5, a GaN substrate 61 having a semipolar main surface 61a whose c-plane was tilted by 75° in the m-axis was prepared. The semipolar main surface 61a forms an angle of 75° with the reference plane Sc. The reference plane Sc is orthogonal to the reference axis Cx extending in the c-axis direction of the GaN substrate 61. The semipolar main surface 61a corresponds to the {20-21} plane. The GaN substrate 61 was set in a growth reactor, supplied with ammonia ($NH_3$) and hydrogen ($H_2$), and held for 10 min at 1050° C. After this pretreatment (thermal cleaning), material gases were supplied to the growth reactor, so as to make the following semiconductor multilayer structure.

First, a 1.2-μm n-type $In_{0.03}Al_{0.14}Ga_{0.83}N$ cladding layer 63 was grown at 880° C. A 0.25-μm n-type GaN guiding layer 65 was grown at 1050° C. A 0.1-μm n-type $In_{0.03}Ga_{0.97}N$ guiding layer 67 was grown at 860° C. Subsequently, an active layer 69 was grown. The active layer 69 had a quantum well structure in which 15-nm barrier layers made of GaN and 3-nm well layers made of $In_{0.30}Ga_{0.70}N$ were alternately laminated. The number of well layers was 3. The growth temperature for the well layers was 720° C., while the growth temperature for the barrier layers was 860° C.

Ammonia ($NH_3$) whose water content was appropriately adjusted was supplied as a nitrogen material when growing the n-type $In_{0.03}Al_{0.14}Ga_{0.83}N$ cladding layer 63, n-type GaN guiding layer 65, n-type $In_{0.03}Ga_{0.97}N$ guiding layer 67, and active layer 69 so that the active layer 69 had an oxygen content of at least $1\times10^{17}$ $cm^{-3}$ but not exceeding $8\times10^{17}$ $cm^{-3}$. For doping the barrier layers with silicon (Si), a monomethylsilane ($CH_3SiH_3$) gas diluted with hydrogen ($H_2$) was supplied at the time of growing them. Different amounts of the monomethylsilane ($CH_3SiH_3$) gas were supplied to Examples 1 and 2 and Comparative Examples 1 and 2, so as to change the silicon content in their barrier layers. The silicon content was analyzed by SIMS (Secondary Ion Mass Spectrometry).

FIG. 6 is a chart listing the monomethylsilane gas flow rate at the time of growing barrier layers, Si content in the barrier layers, and surface roughness in each of Examples 1 and 2 and Comparative Examples 1 and 2. As listed in FIG. 6, the monomethylsilane gas flow rate (sccm) at the time of growing the barrier layers was 0, 0.2, 1, and 10 for Comparative Example 1, Example 1, Example 2, and Comparative Example 2, respectively. The Si content ($cm^{-3}$) in the barrier layers was less than the detection limit, $2.5\times10^{17}$, $1.2\times10^{18}$, and $1.5\times10^{19}$ in Comparative Example 1, Example 1, Example 2, and Comparative Example 2, respectively.

Figure 7:
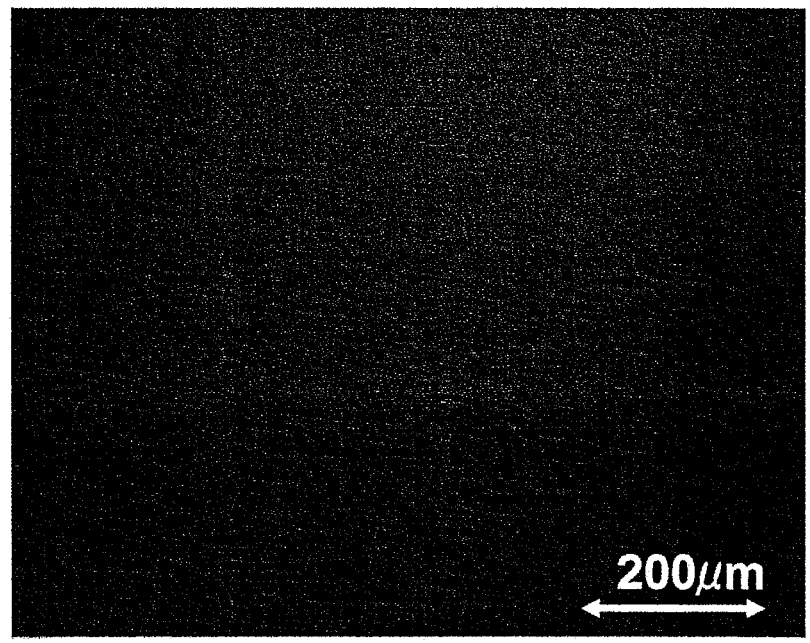
FIG. 7 is a view illustrating a Nomarski micrograph of Example 2.

FIG. 7 is a view illustrating a Nomarski micrograph of the surface of the active layer 69 of Example 2. As illustrated in FIG. 7, the surface of the active layer 69 is flat at a level determinable from the Nomarski micrograph. FIG. 6 lists measured results of surface roughness on the active layer 69 by an AFM (Atomic Force Microscope). The measured area was a 5-μm square, while the surface roughness was evaluated by RMS (Root Mean Square) roughness.

As listed in FIG. 6, the surface roughness (nm) of the active layer 69 was 0.8, 0.3, 0.4, and 1.2 in Comparative Example 1, Example 1, Example 2, and Comparative Example 2, respectively. This showed that the surface roughness of the active layer 69 became smaller in Examples 1 and 2 in which the Si content in the barrier layers fell within the range of at least $1\times10^{17}$ $cm^{-3}$ but not exceeding $1\times10^{19}$ $cm^{-3}$.

Figure 8:
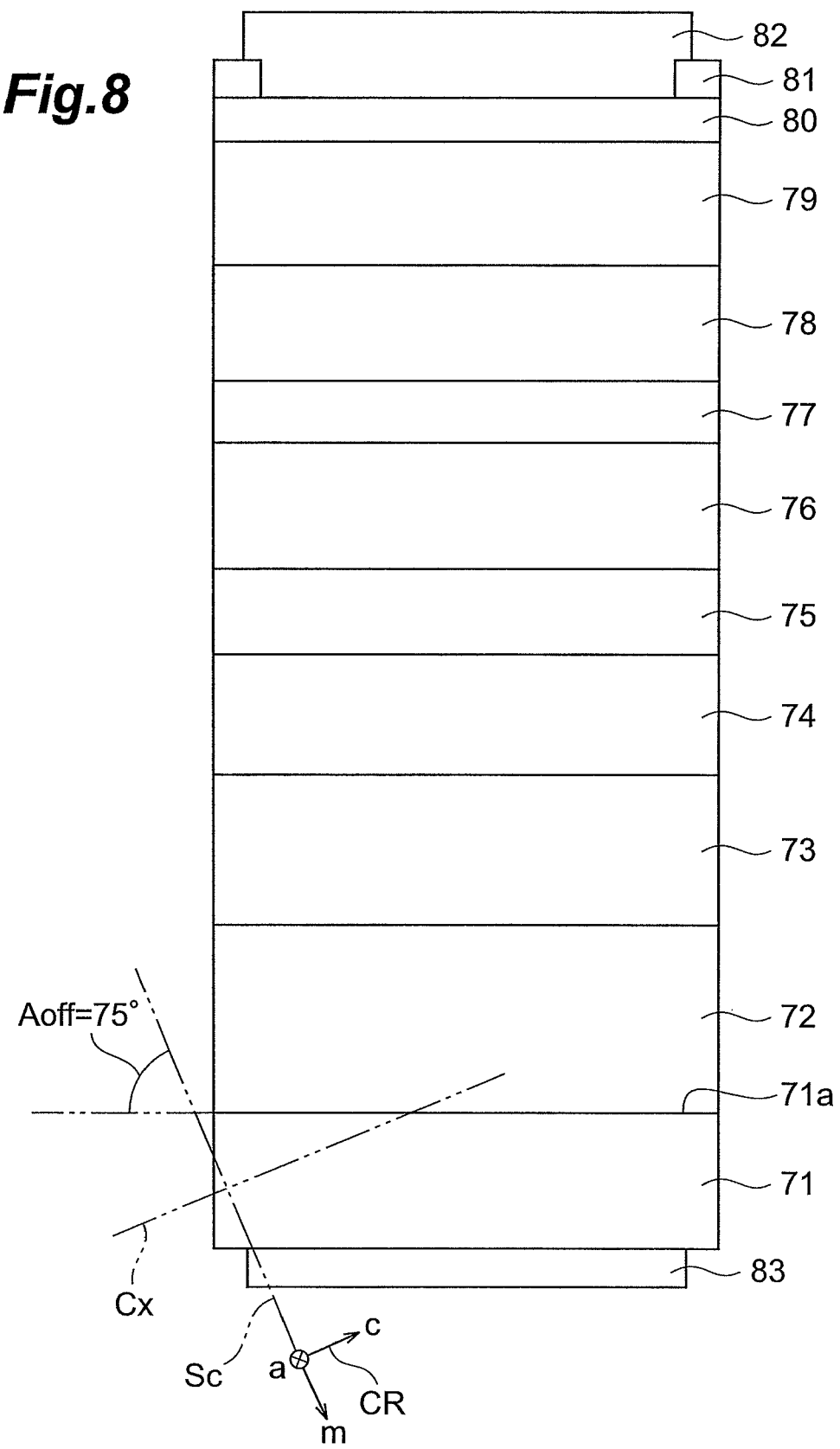
FIG. 8 is a diagram illustrating an LD structure of Examples 3, 4, and 5 and Comparative Examples 3 and 4.

Examples 3, 4, and 5 and Comparative Examples 3 and 4 will now be explained. LDs (Laser Diodes) were made as Examples 3, 4, and 5 and Comparative Examples 3 and 4. FIG. 8 is a diagram illustrating an LD structure of Examples 3, 4, and 5 and Comparative Examples 3 and 4. As illustrated in FIG. 8, a GaN substrate 71 having a semipolar main surface 71a whose c-plane was tilted by 75° in the m-axis was prepared. The semipolar main surface 71a forms an angle of 75° with the reference plane Sc. The reference plane Sc is orthogonal to the reference axis Cx extending in the c-axis direction of the GaN substrate 71. The semipolar main surface 71a corresponds to the {20-21} plane. The GaN substrate 71 was arranged in a growth reactor, supplied with ammonia ($NH_3$) and hydrogen ($H_2$), and held for 10 min in an atmosphere at 1050° C. After this pretreatment (thermal cleaning), material gases were supplied to the growth furnace, so as to make a structure for an LD as in the following.

First, a 1.2-μm n-type $In_{0.03}Al_{0.14}Ga_{0.83}N$ cladding layer 72 was grown at 880° C. A 0.25-μm n-type GaN guiding layer 73 was grown at 1050° C. A 0.1-μm n-type $In_{0.03}Ga_{0.97}N$ guiding layer 74 was grown at 860° C. Subsequently, an active layer 75 was grown. The active layer 75 had a quantum well structure in which 15-nm barrier layers made of GaN and 3-nm well layers made of $In_{0.30}Ga_{0.70}N$ were alternately laminated. The number of well layers was 2. The growth temperature for the well layers was 720° C., while the growth temperature for the barrier layers was 860° C. Subsequently, an undoped $In_{0.03}Ga_{0.97}N$ guiding layer 76 was grown by 0.1 μm at 860° C. A 0.02-μm p-type $Al_{0.12}Ga_{0.88}N$ electron blocking layer 77, a 0.25-μm p-type GaN guiding layer 78, a 0.4-μm p-type $In_{0.03}Al_{0.14}Ga_{0.83}N$ cladding layer 79, and a 0.05-μm p-type GaN contact layer 80 were grown in sequence at 900° C. An anode electrode unit 82 made of Ni/Au was formed by vapor deposition on the p-type GaN contact layer 80 through a stripe-shaped opening having a width of 10 μm in an insulating film 81 made of silicon oxide ($SiO_2$), while a cathode electrode unit 83 constituted by a Ti/Al electrode and a Ti/Au pad electrode was formed by vapor deposition on the rear surface of the GaN substrate 71. The extending direction of the stripe-shaped opening was in alignment with the projection of the m-axis of the GaN substrate 71 on the main surface 71a. Then, the GaN substrate 71 was cut along surfaces perpendicular to the extending direction of the stripe-shaped opening at intervals of 600 μm. One of the cut end surfaces was coated with a multilayer reflecting film having a reflectance of 80%, while the other end surface was coated with a multilayer reflecting film having a reflectance of 95%. Thus, a gain-guided LD was made.

Ammonia ($NH_3$) whose water content was appropriately adjusted was supplied as a nitrogen material when growing the layers ranging from the n-type $In_{0.03}Al_{0.14}Ga_{0.83}N$ cladding layer 72 to the p-type GaN contact layer 80 so that the active layer 75 had an oxygen content of at least $1\times10^{17}$ cm$^{-3}$ but not exceeding $8\times10^{17}$ cm$^{-3}$. For doping the barrier layers with silicon (Si), a monomethylsilane ($CH_3SiH_3$) gas diluted with hydrogen ($H_2$) was supplied at the time of growing them. Different amounts of the monomethylsilane ($CH_3SiH_3$) gas were supplied to Examples 3, 4, and 5 and Comparative Examples 3 and 4, so as to change the silicon content in their barrier layers. The silicon content was analyzed by SIMS (Secondary Ion Mass Spectrometry).

FIG. 9 is a chart listing the monomethylsilane gas flow rate at the time of growing barrier layers, Si content in the barrier layers, LD driving voltage, and LD threshold current in each of Examples 3, 4, and 5 and Comparative Examples 3 and 4. The driving voltage and threshold current were measured under pulsed driving with a pulse width of 0.5 sec and a duty cycle of 0.1% at room temperature. As listed in FIG. 9, the monomethylsilane gas flow rate (sccm) at the time of growing the barrier layers was 0, 0.2, 0.5, 1, and 10 for Comparative Example 3, Example 3, Example 4, Example 5, and Comparative Example 4, respectively. The Si content (cm$^{-3}$) in the barrier layers was less than the detection limit, $2.5\times10^{17}$, $6.0\times10^{17}$, $1.2\times10^{18}$, and $1.5\times10^{19}$ in Comparative Example 3, Example 3, Example 4, Example 5, and Comparative Example 4, respectively. The driving voltage (V) at an output of 5 mW was 10.8, 7.2, 6.4, 5.7, and 5.4 in Comparative Example 3, Example 3, Example 4, Example 5, and Comparative Example 4, respectively. The threshold current (mA) was 350, 280, 240, 250, and 480 in Comparative Example 3, Example 3, Example 4, Example 5, and Comparative Example 4, respectively. The lasing wavelength fell within the range of 520 to 530 nm in all of Examples 3, 4, and 5 and Comparative Examples 3 and 4.

These results showed that the LD driving voltage and threshold current became lower in Examples 3, 4, and 5 in which the Si content in the barrier layers fell within the range of at least $1\times10^{17}$ cm$^{-3}$ but not exceeding $1\times10^{19}$ cm$^{-3}$.

Figure 10:
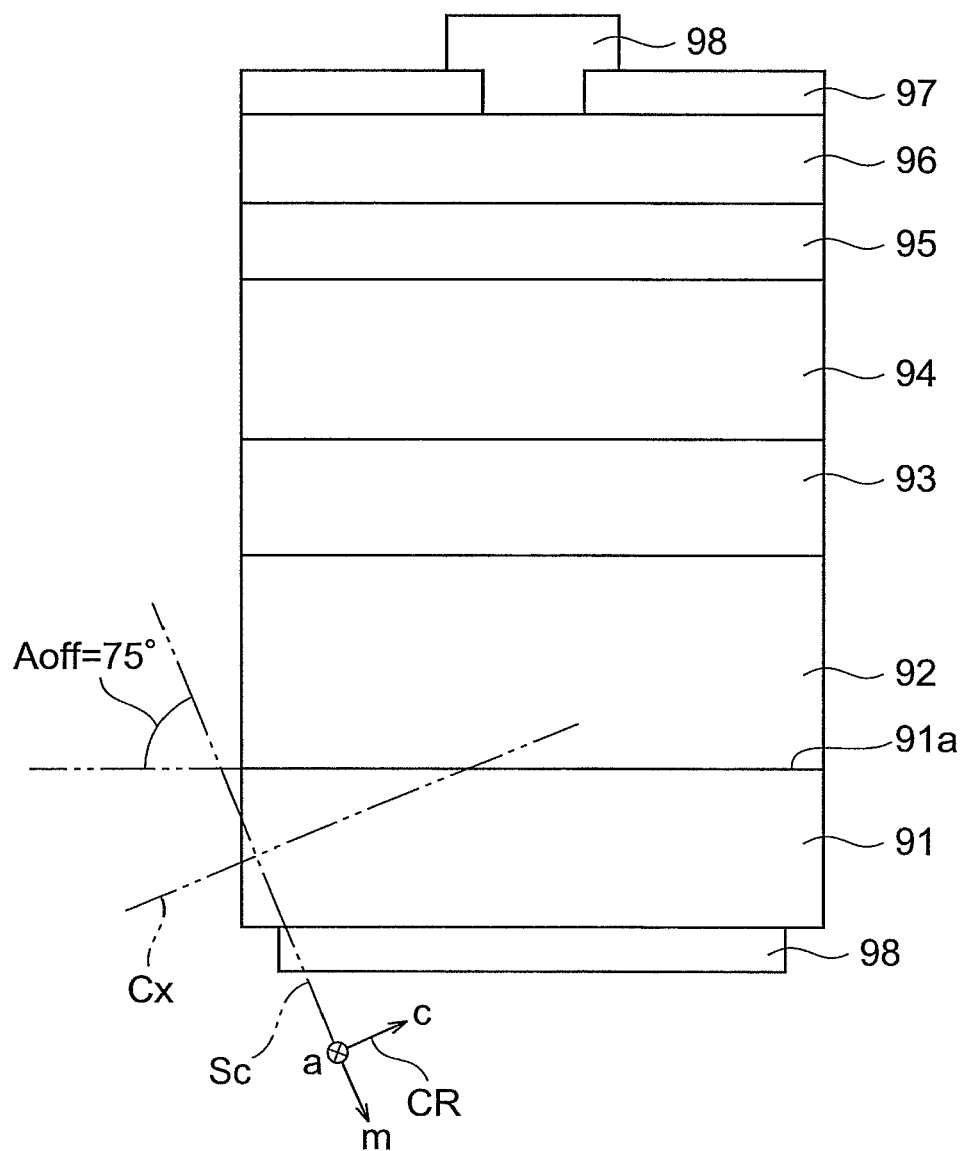
FIG. 10 is a diagram illustrating an LED structure of Examples 6 and 7 and Comparative Example 5.

Examples 6 and 7 and Comparative Example 5 will now be explained. LEDs (Light-Emitting Diodes) were made as Examples 6 and 7 and Comparative Example 5. FIG. 10 is a diagram illustrating an LED structure of Examples 6 and 7 and Comparative Example 5. As illustrated in FIG. 10, a GaN substrate 91 having a semipolar main surface 91a whose c-plane was tilted by 75° in the m-axis was prepared. The semipolar main surface 91a forms an angle of 75° with the reference plane Sc. The reference plane Sc is orthogonal to the reference axis Cx extending in the c-axis direction of the GaN substrate 91. The semipolar main surface 91a corresponds to the {20-21} plane. The GaN substrate 91 was set in a growth reactor, supplied with ammonia ($NH_3$) and hydrogen ($H_2$), and held for 10 min in an atmosphere at 1050° C. After this pretreatment (thermal cleaning), material gases were supplied to the growth furnace, so as to make a structure for an LED as in the following.

First, a 2-μm n-type GaN buffer layer 92 was grown at 1050° C. A 1000-nm n-type $In_{0.03}Ga_{0.97}N$ buffer layer 93 was grown at 860° C. Subsequently, an active layer 94 was grown. The active layer 94 had a quantum well structure in which 15-nm barrier layers made of GaN and 3-nm well layers made of $In_{0.30}Ga_{0.70}N$ were alternately laminated. The number of well layers was 3. The growth temperature for the well layers was 720° C., while the growth temperature for the barrier layers was 860° C. Subsequently, a 20-nm p-type $Al_{0.12}Ga_{0.88}N$ electron blocking layer 95 and a 50-nm p-type GaN contact layer 96 were grown in sequence at 900° C. On the p-type GaN contact layer 96, an anode electrode 97, which was made of Ni/Au and had an opening, and a pad electrode 98, which was made of Ti/Au and in contact with the p-type GaN contact layer 96 through the opening of the anode electrode 97, were vapor-deposited.

Ammonia ($NH_3$) whose water content was appropriately adjusted was supplied as a nitrogen material when growing the layers ranging from the n-type GaN buffer layer 92 to the p-type GaN contact layer 96 so that the active layer 94 had an oxygen content of at least $1\times10^{17}$ cm$^{-3}$ but not exceeding $8\times10^{17}$ cm$^{-3}$. For doping the barrier layers with silicon (Si), a monomethylsilane ($CH_3SiH_3$) gas diluted with hydrogen ($H_2$) was supplied at the time of growing them. Different amounts of the monomethylsilane ($CH_3SiH_3$) gas were supplied to Examples 6 and 7 and Comparative Example 5, so as to change the silicon content in their barrier layers. The silicon content was analyzed by SIMS (Secondary Ion Mass Spectrometry). Also, the dark spot density corresponding to the threading dislocation density was measured by a cathodoluminescence (CL) method.

FIG. 11 is a chart listing the monomethylsilane gas flow rate at the time of growing barrier layers, Si content in the barrier layers, dark spot density, and LED output in each of Examples 6 and 7 and Comparative Example 5. The LED output was measured under pulsed driving at room temperature. As listed in FIG. 11, the monomethylsilane gas flow rate (sccm) at the time of growing the barrier layers was 0, 1, and 5 for Comparative Example 5, Example 6, and Example 7, respectively. The Si content (cm$^{-3}$) in the barrier layers was less than the detection limit, $1.2\times10^{18}$, and $6.1\times10^{18}$ in Comparative Example 5, Example 6, and Example 7, respectively. The dark spot density (cm$^{-2}$) was $2.0\times10^{6}$, $3.0\times10^{5}$, and $8.0\times10^{4}$, respectively. The LED output (mW) at a driving current of 500 mA was 11, 14, and 15 in Comparative Example 5, Example 6, and Example 7, respectively. The emission wavelength fell within the range of 520 to 530 nm in all of Examples 6 and 7 and Comparative Example 5.

The measurement results illustrated in FIG. 11 showed that Examples 6 and 7 in which the Si content in the barrier layers fell within the range of at least $1\times10^{17}$ cm$^{-3}$ but not exceeding $1\times10^{19}$ cm$^{-3}$ yielded lower dark spot density (threading dislocation density) and greater LED output.

FIG. 12(a) is a view illustrating a CL image of Comparative Example 5, while FIG. 12(b) is a view illustrating a CL image of Example 6. As illustrated in FIG. 12, Comparative Example 5 and Example 6 showed no great difference between their degrees of intensity density in CL images, though yielding a difference in dark spot density. This indicates that the composition fluctuation of In is small in the well layers of the active layer grown on the semipolar main surface 91a, regardless of whether the barrier layers are doped with Si or not.

Figure 13:
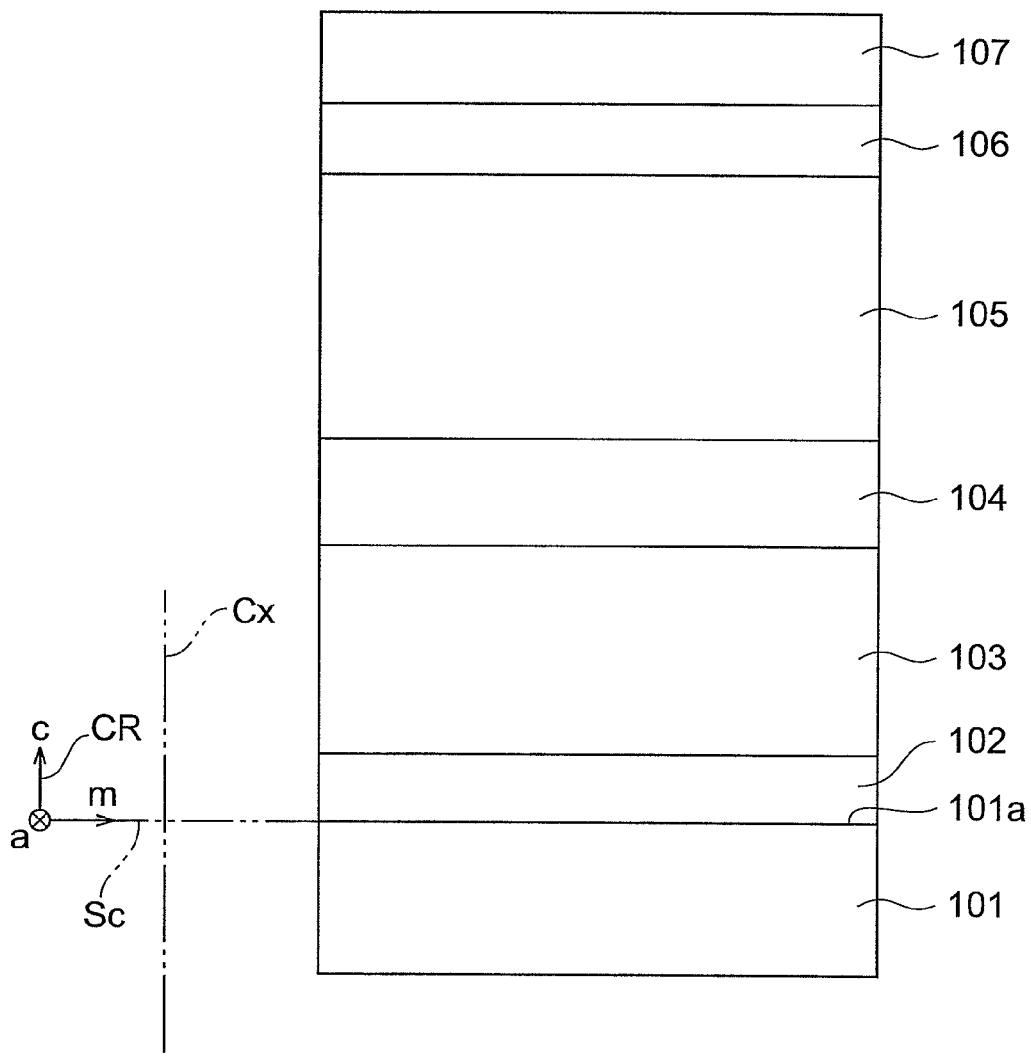
FIG. 13 is a diagram illustrating an LED structure of Comparative Examples 6 and 7.

Comparative Examples 6 and 7 will now be explained. LEDs were made as Comparative Examples 6 and 7. FIG. 13 is a diagram illustrating an LED structure of Comparative Examples 6 and 7. As illustrated in FIG. 13, a GaN substrate 101 having a main surface 101a on the c-plane was prepared. The main surface 101a is a polar surface. The main surface 101 exhibiting polarity is parallel to the reference plane Sc. The reference plane Sc is orthogonal to the reference axis Cx extending in the c-axis direction of the GaN substrate 101. The main surface 101a is the {0001} plane. The GaN substrate 101 was set in a growth reactor, supplied with ammonia ($NH_3$) and hydrogen ($H_2$), and held for 10 min in an atmosphere at 1050° C. After this pretreatment (thermal cleaning), material gases were supplied to the growth furnace, so as to make a structure for an LED as in the following.

First, a 50-nm n-type $Al_{0.12}Ga_{0.88}N$ buffer layer 102 was grown at 1100° C. A 2-μm n-type GaN guiding layer 103 was grown at 1180° C. A 100-nm n-type $In_{0.03}Ga_{0.97}N$ guiding layer 104 was grown at 880° C. Subsequently, an active layer 105 was grown. The active layer 105 had a quantum well structure in which 15-nm barrier layers made of $In_{0.02}Ga_{0.98}N$ and 5-nm well layers made of $In_{0.14}Ga_{0.86}N$ were alternately laminated. The number of well layers was 6. The growth temperature for the well layers was 840° C., while the growth temperature for the barrier layers was 860° C. Subsequently, a 20-nm p-type $Al_{0.12}Ga_{0.88}N$ electron blocking layer 106 and a 50-nm p-type GaN contact layer 107 were grown in sequence at 1100° C.

For doping the barrier layers with silicon (Si), a monomethylsilane ($CH_3SiH_3$) gas diluted with hydrogen ($H_2$) was supplied at the time of growing them. Different amounts of the monomethylsilane ($CH_3SiH_3$) gas were supplied to Comparative Examples 6 and 7, so as to change the silicon content in their barrier layers. The silicon content was analyzed by SIMS (Secondary Ion Mass Spectrometry). Also, light emission images were measured by the cathodoluminescence (CL) method, while the emission wavelength and light emission intensity were measured by a photoluminescence (PL) method.

FIG. 14 is a chart listing the Si content in the barrier layers, PL wavelength, and PL intensity in each of Comparative Examples 6 and 7. As listed in FIG. 14, the Si content ($cm^{-3}$) in the barrier layers was the background level and $1.0 \times 10^{18}$ in Comparative Examples 6 and 7, respectively. The PL wavelength (nm) was 467 and 449 in Comparative Examples 6 and 7, respectively. The PL intensity (arbitrary unit) was 950 and 530 in Comparative Examples 6 and 7, respectively. The measurement results listed in FIG. 14 showed that the PL intensity greatly decreased when the barrier layers were doped with Si in LEDs using a GaN substrate employing a polar surface (c-plane) as a main surface. FIG. 15(a) is a view illustrating the light emission image of Comparative Example 6 by the cathodoluminescence method, while FIG. 15(b) is a view illustrating the light emission image of Comparative Example 7 by the cathodoluminescence method. The measurement results illustrated in FIG. 15 showed that the intensity fluctuation in light emission decreased when the barrier layers were doped with Si in LEDs using the GaN substrate employing the polar surface (c-plane) as the main surface. These results made it clear that, while the PL intensity increased because of the localized level light emission caused by In composition fluctuations in the well layers when the barrier layers were not doped with Si in LEDs using the GaN substrate employing the polar surface (c-plane) as the main surface, doping the barrier layers with Si reduced the localized level light emission as the In composition fluctuations decreased in the well layers, thereby lowering the PL intensity.

REFERENCE SIGNS LIST 11a, 11b ... group III nitride semiconductor optical device; 13 ... group III nitride semiconductor substrate; 13a ... group III nitride semiconductor substrate main surface; 17 ... active layer; 28 ... well layer; 28Sd ... lower interface; 29 ... barrier layer; 29u ... upper near-interface area; Cx ... reference axis; Sc ... reference plane

The invention claimed is:

1. A group III nitride semiconductor optical device comprising:
   a group III nitride semiconductor substrate, made of a group III nitride semiconductor, having a main surface forming a finite angle with a reference plane orthogonal to a reference axis extending in a c-axis direction of the group III nitride semiconductor; and
   an active layer of a quantum-well structure, disposed on the main surface of the group III nitride semiconductor substrate, including a well layer made of a group III nitride semiconductor and a plurality of barrier layers made of a group III nitride semiconductor;
   wherein the main surface exhibits semipolarity;
   wherein the active layer is an epitaxial layer and has an oxygen content of at least $1 \times 10^{17}$ $cm^{-3}$ but not exceeding $8 \times 10^{17}$ $cm^{-3}$; and
   wherein the plurality of barrier layers contain an n-type impurity other than oxygen by at least $1 \times 10^{17}$ $cm^{-3}$ but not exceeding $1 \times 10^{19}$ $cm^{-3}$ in a near-interface area in contact with an interface of the well layer on the group III nitride semiconductor substrate side.

2. The group III nitride semiconductor optical device according to claim 1, wherein the n-type impurity contained in the barrier layers is at least one of silicon, germanium, and tin.

3. The group III nitride semiconductor optical device according to claim 1, wherein the plurality of barrier layers contain the n-type impurity other than oxygen by at least $1 \times 10^{17}$ $cm^{-3}$ but not exceeding $1 \times 10^{19}$ $cm^{-3}$ in both an upper near-interface area and a lower near interface area in contact with the interface of the well layer.

4. The group III nitride semiconductor optical device according to claim 1, wherein the plurality of barrier layers contain the n-type impurity other than oxygen by at least $1 \times 10^{17}$ $cm^{-3}$ but not exceeding $1 \times 10^{19}$ $cm^{-3}$ throughout the thickness thereof.

5. The group III nitride semiconductor optical device according to claim 1, wherein the content of the n-type impurity is at least $5 \times 10^{17}$ $cm^{-3}$.

6. The group III nitride semiconductor optical device according to claim 1, wherein the content of the n-type impurity is at least $1 \times 10^{18}$ $cm^{-3}$.

7. The group III nitride semiconductor optical device according to claim 1, wherein the main surface is a {20-21} plane.

8. The group III nitride semiconductor optical device according to claim 1, wherein the main surface is a {20-2-1} plane.

9. The group III nitride semiconductor optical device according to claim 1, wherein the dislocation density through the active layer is $1 \times 10^6$ $cm^{-2}$ or less.

10. The group III nitride semiconductor optical device according to claim 1, wherein the dislocation density through the active layer is $1\times10^5$ cm$^{-2}$ or less.

11. The group III nitride semiconductor optical device according to claim 1, wherein a normal vector indicating a direction normal to the main surface and a reference vector indicating a direction of the reference axis form an angle falling within any of ranges of at least 10° but not exceeding 80° and at least 100° but not exceeding 170°.

12. The group III nitride semiconductor optical device according to claim 11, wherein the normal vector and the reference vector form an angle falling within any of ranges of at least 71° but not exceeding 79° and at least 101° but not exceeding 109°.

13. The group III nitride semiconductor optical device according to claim 11, wherein the normal vector and the reference vector form an angle falling within any of ranges of at least 63° but not exceeding 80° and at least 100° but not exceeding 117°.

14. The group III nitride semiconductor optical device according to claim 13, further comprising:
 a first semiconductor layer of a first conduction type made of a group III nitride semiconductor layer; and
 a second semiconductor layer of a second conduction type made of a group III nitride semiconductor layer;
 wherein the first semiconductor layer is disposed between the group III nitride semiconductor substrate and the active layer;
 wherein the active layer is disposed between the first and second semiconductor layers;
 wherein the active layer includes a plurality of well layers; and
 wherein a semiconductor layer containing an n-type impurity other than oxygen exists between the well layer located closest to the second semiconductor layer in the plurality of well layers and the second semiconductor layer.

15. The group III nitride semiconductor optical device according to claim 11, wherein the normal vector lies in a direction obtained by rotating the reference vector about an a-axis of the group III nitride semiconductor.

16. The group III nitride semiconductor optical device according to claim 15, wherein the main surface and the a-plane form an angle of at least 87° but not exceeding 93°.

17. The group III nitride semiconductor optical device according to claim 11, wherein the normal vector lies in a direction obtained by rotating the reference vector about the m-axis of the group III nitride semiconductor.

18. The group III nitride semiconductor optical device according to claim 17, wherein the main surface and the m-plane form an angle of at least 87° but not exceeding 93°.

* * * * *